US011377592B2

(12) United States Patent
Lüchinger et al.

(10) Patent No.: US 11,377,592 B2
(45) Date of Patent: *Jul. 5, 2022

(54) LUMINESCENT CRYSTALS AND MANUFACTURING THEREOF

(71) Applicant: Avantama AG, Stäfa (CH)

(72) Inventors: Norman Albert Lüchinger, Meilen (CH); Marek Oszajca, Männedorf (CH); Patrick Kissel, Herrliberg (CH); Loredana Protesescu, Dorchester, MA (US); Maksym Kovalenko, Zürich (CH); Franziska Krieg, Wädenswil (CH)

(73) Assignee: Avantama AG, Stäfa (CH)

( * ) Notice: Subject to any disclaimer, the term of this patent is extended or adjusted under 35 U.S.C. 154(b) by 0 days.

This patent is subject to a terminal disclaimer.

(21) Appl. No.: 17/122,526

(22) Filed: Dec. 15, 2020

(65) Prior Publication Data

US 2021/0122974 A1 Apr. 29, 2021

Related U.S. Application Data

(63) Continuation of application No. 15/744,961, filed as application No. PCT/EP2017/065713 on Jun. 26, 2017, now Pat. No. 10,899,756.

(30) Foreign Application Priority Data

Aug. 11, 2016 (EP) ..................................... 16183790

(51) Int. Cl.
*C09K 11/77* (2006.01)
*C09K 11/66* (2006.01)
(Continued)

(52) U.S. Cl.
CPC ............ *C09K 11/7705* (2013.01); *B82B 1/00* (2013.01); *B82Y 20/00* (2013.01); *B82Y 30/00* (2013.01);
(Continued)

(58) Field of Classification Search
CPC ... C09K 11/664; C09K 11/665; C09K 11/025; C09K 11/02; B82Y 20/00; B82Y 30/00
See application file for complete search history.

(56) References Cited

U.S. PATENT DOCUMENTS 7,641,815 B2    1/2010  Varadarajan et al.
10,193,088 B2 * 1/2019  Lee ..................... H01L 51/0037
(Continued)

FOREIGN PATENT DOCUMENTS

CN   106675559 A1   5/2017
JP   2008227330 A1  9/2008
(Continued)

OTHER PUBLICATIONS

International Search Report and Written Opinion for corresponding International Application No. PCT/EP2017/065713 dated Sep. 19, 2017.
(Continued)

*Primary Examiner* — C Melissa Koslow
(74) *Attorney, Agent, or Firm* — Renner, Otto, Boisselle & Sklar, LLP

(57) ABSTRACT

The present invention relates to the field of luminescent crystals (LCs), and more specifically to Quantum Dots (QDs) of formula $A^1_a M^2_b X_c$, wherein the substituents are as defined in the specification. The invention provides methods of manufacturing such luminescent crystals, particularly by dispersing suitable starting materials in the presence of a liquid and by the aid of milling balls; to compositions comprising luminescent crystals and to electronic devices,
(Continued)

decorative coatings; and to components comprising luminescent crystals.

24 Claims, 4 Drawing Sheets

(51) Int. Cl.

| | | |
|---|---|---|
| *C07F 7/24* | (2006.01) | |
| *C07F 9/142* | (2006.01) | |
| *H01L 51/52* | (2006.01) | |
| *C09K 11/02* | (2006.01) | |
| *B82Y 30/00* | (2011.01) | |
| *B82Y 20/00* | (2011.01) | |
| *B82B 1/00* | (2006.01) | |
| *C30B 29/12* | (2006.01) | |
| *C30B 29/54* | (2006.01) | |

(52) U.S. Cl.
CPC ............... *C07F 7/24* (2013.01); *C07F 9/142* (2013.01); *C09K 11/02* (2013.01); *C09K 11/025* (2013.01); *C09K 11/664* (2013.01); *C09K 11/665* (2013.01); *C09K 11/7704* (2013.01); *C30B 29/12* (2013.01); *C30B 29/54* (2013.01); *H01L 51/5262* (2013.01)

(56) References Cited

U.S. PATENT DOCUMENTS

| | | | |
|---|---|---|---|
| 10,424,696 B2 * | 9/2019 | Lee | C09K 11/025 |
| 10,483,046 B2 | 11/2019 | Bakr et al. | |
| 10,889,756 B2 * | 1/2021 | Luchinger | C07F 9/142 |
| 10,920,137 B2 * | 2/2021 | Luchinger | C09D 11/50 |
| 11,098,247 B2 * | 8/2021 | Luchinger | H01L 33/502 |
| 2009/0004098 A1 | 1/2009 | Schmidt et al. | |
| 2011/0284374 A1 | 11/2011 | Krejci et al. | |
| 2017/0358758 A1 | 12/2017 | Lee et al. | |
| 2018/0208840 A1 | 7/2018 | Luchinger et al. | |

FOREIGN PATENT DOCUMENTS

| | | | |
|---|---|---|---|
| JP | 2014078392 A1 | | 1/2014 |
| WO | 2016/024159 A1 | | 2/2016 |
| WO | 2016072803 A1 | | 5/2016 |
| WO | 2016072805 A1 | | 5/2016 |
| WO | WO 2016/072803 | * | 5/2016 |
| WO | WO 2016/072804 | * | 5/2016 |
| WO | WO 2016/072805 | * | 5/2016 |
| WO | 2016102157 A1 | | 6/2016 |
| WO | WO 2016/102157 | * | 6/2016 |
| WO | 2016121700 A1 | | 8/2016 |
| WO | 2017221837 A1 | | 12/2017 |

OTHER PUBLICATIONS

Ayguler et al., "Light-Emitting Electrochemical Cells Based on Hybrid Lead Halide Perovskite Nanoparticles", The Journal of Physical Chemistry C, vol. 119, No. 21, May 8, 2015, pp. 12047-1054 (cited in specification on p. 1).

Li et al. , "Efficient Light-Emitting Diodes Based on Nanocrystalline Perovskite in a Dielectric Polymer Matrix", Nano Letters, vol. 15, No. 4, Feb. 24, 2015, pp. 2640-2644.

Protesescu et al., "Nanocrystals of Cesium Lead Halide Perovskites (CsPbX3, X = Cl, Br, and I): Novel Optoelectronic Materials Showing Bright Emission with Wide Color Gamut", Nano Letters, vol. 15, 2015, pp. 3692-3696 (cited in specification on p. 1).

Li et al., "Stabilizing Perovskite Structures by Tuning Tolerance Factor: Formation of Formamidinium and Cesium Lead Iodide Solid-State Alloys", Chemistry of Materials, vol. 28, 2015, pp. 284-292 (cited in specification on p. 2).

Tang et al., "Identifying Key Properties of Electrolytes for Light-Emitting Electrochemical Cells", Chemistry of Materials, vol. 26, 2014, pp. 5083-5088.

Zhang et al., "Brightly Luminescent and Color-Tunable Colloidal CHsNHsPbXs (X = Br, I, Cl) Quantum Dots: Potential Alternatives for Display Technology", ACS Nano(2015), vol. 9, No. 4, 4533-4542.

Pathak et al., "Perovskite Crystals for Tunable White Light Emission", Chem. Mater. 2015, 27, 8066-8075.

Tadros, T. F. (2015). "Interfacial phenomena and colloid stability : Basic principles" vol. 1, DeGruyter, ISBN978-3-11-028340-2.

Wikipedia entry for "Surfactant" dated Jan. 10, 2016 available to view at: https://en.wikipedia.org/w/index.php?title=Surfactant&oldid=699208666#Classification of surfactants.

Green et al. "The emergence of perovskite solar cells", Nature Photonics, vol. 8, Jul. 2014, p. 506-514.

Mcmeekin et al. "A mixed-cation lead mixed-halide perovskite absorber for tandem solar cells", Science, Jan. 8, 2016, vol. 351, Issue 6269, p. 151-155.

De Roo et al. "Highly Dynamic Ligand Binding and Light Absorption Coefficient of Cesium Lead Bromide Perovskite Nanocrystals", ACS Nano 2016, 10, 2071-2081.

Ling et al., "Bright Light-Emitting Diodes Based on Organometal Halide Perovskite Nanoplatelets", Adv. Mater., vol. 28, #2, Nov. 17, 2015, pp. 305-311.

* cited by examiner

LUMINESCENT CRYSTALS AND MANUFACTURING THEREOF

This application is a continuation of U.S. patent application Ser. No. 15/744,961, filed Jan. 15, 2018, now U.S. Pat. No. 10,889,756 issued Jan. 12, 2021, which is a U.S. national phase of International Application No. PCT/EP2017/065713 filed Jun. 26, 2017 and published in the English language, and claims priority to European Application No. 16 183 790.1 filed on Aug. 11, 2016, which are hereby incorporated herein by reference.

The present invention relates to the field of luminescent crystals (LCs), and more specifically to Quantum Dots (QDs). The invention provides methods of manufacturing such luminescent crystals, to compositions comprising luminescent crystals and to electronic devices, decorative coatings and components comprising LCs.

Luminescent Crystals, specifically Quantum Dots, are a known class of materials. Such QDs find many applications in industrial and commercial products, including electronic devices, such as light emitting diodes or displays.

Protesescu et al. (Nano Lett., 2015, 15, 3692-3696) disclose a new class of luminescent quantum dots (QDs) of high quality. QDs were synthesized with cheap chemicals and with very high size precision; QD size was controlled by adjusting the synthesis parameters such as temperature and reaction time. However, only very small amounts were synthesized, as the method is difficult to control (due to the very fast particle growth kinetics of this material composition) and difficult in scale-up. Further, the reaction is non-stoichiometric, resulting in a large amount of by-products. Furthermore, the reaction can only be conducted in high-boiling solvents like octadecene (due to the high reaction temperatures) which requires a solvent-exchange if the QD's are needed in a low-boiling solvent like toluene for the final application. This synthesis route is known as "hot injection method", using standard laboratory equipment. Due to these disadvantages, the method of synthesizing QDs is commercially not attractive rendering the QDs expensive.

Aygüler et al (J. Phys. Chem. C 2015, 119, 12047-12054) disclose light emitting electrochemical cells based on hybrid lead halide perovskite nanoparticles. The authors disclose a method for manufacturing such nanoparticles of 50-90 nm size, also realizing that size distribution is not homogeneous. The document also points to the difficulties in obtaining these materials, as the dropwise addition of reactants is crucial to obtain pure compounds. Also, capping agents are needed to control and limit crystal growth.

Li et al (Chem. Mater., 2015, 284-292) describe the formation of $(FA, Cs)PbI_3$ solid state alloys in bulk film form to stabilize Perovskite Structures, where FA represents formamidinium. The materials disclosed in that document do not show luminescence. The formation of the films is obtained via solution in N,N-dimethylformamide.

Thus, it is an object of the present invention to mitigate at least some of these drawbacks of the state of the art. In particular, it is an aim of the present invention to provide improved manufacturing methods of LCs/QDs. It is a further aim to provide new materials comprising LCs/QDs suitable for a wide variety of applications, including electronic devices, and optical devices and decorative coatings.

These objectives are achieved by the method for manufacturing luminescent crystals, the composition, the component and the device described herein. Further aspects of the invention are disclosed in the specification and independent claims, preferred embodiments are disclosed in the specification and the dependent claims. The invention particularly provides for:

a method for manufacturing luminescent crystals, specifically quantum dots (1st aspect);

compositions in the form of a suspension, also termed "ink", or "pre-polymer dispersion", and its uses ($2^{nd}$ aspect);

a solid polymer composition and its uses ($3^{rd}$ aspect);

a component ($4^{th}$ aspect);

a device (including electronic devices, optical devices) and articles comprising a coated surface ($5^{th}$ aspect);

a method for manufacturing of a polymer composition ($6^{th}$ aspect);

a method for manufacturing a component ($7^{th}$ aspect); and a method for manufacturing a device ($8^{th}$ aspect).

The present invention will be described in detail below. It is understood that the various embodiments, preferences and ranges as provided/disclosed in this specification may be combined at will. Further, depending of the specific embodiment, selected definitions, embodiments or ranges may not apply.

Unless otherwise stated, the following definitions shall apply in this specification:

The terms "a", "an," "the" and similar terms used in the context of the present invention are to be construed to cover both the singular and plural unless otherwise indicated herein or clearly contradicted by the context. Further, the terms "including", "containing" and "comprising" are used herein in their open, non-limiting sense. The term "containing" shall include both, "comprising" and "consisting of".

Percentages are given as weight-%, unless otherwise indicated herein or clearly contradicted by the context.

The term "luminescent crystals" (LC) is known in the field and relates to crystals of 3-500 nm, made of semiconductor materials. The term comprises quantum dots, typically in the range of 3-15 nm and nanocrystals, typically in the range of more than 15 nm and up to 100 nm (preferably up to 50 nm) and crystals, typically in the range more than 100 nm and up to 500 nm. Preferably, luminescent crystals are approximately isometric (such as spherical or cubic). Particles are considered approximately isometric, in case the aspect ratio (longest:shortest direction) of all 3 orthogonal dimensions is 1-2. Accordingly, an assembly of LCs preferably contains 50-100% (n/n), preferably 66-100% (n/n) much preferably 75-100% (n/n) isometric nanocrystals.

LCs show, as the term indicates, luminescence. In the context of the present invention the term luminescent crystal includes single crystals or can be polycrystalline particles. In the latter case, one particle may be composed of several crystal domains (grains), connected by crystalline or amorphous phase boundaries. A luminescent crystal is spatially separated from other particles due to the presence of a surfactant. A luminescent crystal is a semiconducting material which exhibits a direct bandgap (typically in the range 1.1-3.8 eV, more typically 1.4-3.5 eV, even more typically 1.7-3.2 eV). Upon illumination with electromagnetic radiation equal or higher than the bandgap, the valence band electron is excited to the conduction band leaving an electron hole in the valence band. The formed exciton (electron-electron hole pair) then radiatively recombines in the form of photoluminescence, with maximum intensity centered around the LC bandgap value and exhibiting photoluminescence quantum yield of at least 1%. In contact with external electron and electron hole sources LC could exhibit electroluminescence. In the context of the present invention LCs do not exhibit mechanoluminescence (e.g. piezoluminescence), chemiluminescence, electrochemiluminescence nor thermoluminescence.

The term "quantum dot" (QD) is known and particularly relates to semiconductor nanocrystals, which have a diameter typically between 3-15 nm. In this range, the physical diameter of the QD is smaller than the bulk excitation Bohr radius, causing quantum confinement effect to predominate. As a result, the electronic states of the QD, and therefore the bandgap, are a function of the QD composition and physical size, i.e. the color of absorption/emission is linked with the QD size. The optical quality of the QDs sample is directly linked with their homogeneity (more monodisperse QDs will have smaller FWHM of the emission). When QD reach size bigger than the Bohr radius the quantum confinement effect is hindered and the sample may not be luminescent anymore as nonradiative pathways for exciton recombination may become dominant. Thus, QDs are a specific subgroup of nanocrystals, defined in particular by its size and size distribution. Properties of the QDs are directly linked with these parameters, distinguishing them from nanocrystals.

The term "solvent" is known in the field and particularly includes aliphatic hydrocarbons, aromatic hydrocarbons, ethers (including glycol-ethers), esters, alcohols, ketones, amines, amides, sulfones, phosphines, alkylcarbonates. The above organics can be substituted or unsubstituted by one or more substituents, for example by halogen (such as fluoro), Hydroxy, C1-4 alkoxy (such as methoxy or ethoxy) and alkyl (such as methyl, ethyl, isopropyl). The above organics include linear, branched and cyclic derivatives. There can also be unsaturated bonds in the molecule. The above compounds typically have 4-24 carbon atoms, preferably 5-12 carbon atoms, most preferably 6-10 carbon atoms.

The terms "surfactant", "ligand", "dispersant" and "dispersing agent" are known in the field and have essentially the same meaning. In the context of the present invention, these terms denote an organic substance, other than a solvent, which is used in suspensions or colloids to improve the separation of particles and to prevent agglomeration or settling. Without being bound to theory, it is believed that surfactants are physically or chemically attached on the particle surface either before or after adding the particles to the solvent and thereby provide the desired effects. The term surfactants includes polymer materials and small molecules; surfactants typically contain polar functional end-groups and apolar end-groups. In the context of the present invention, solvents (e.g. toluene) are not considered surfactants.

The term "suspension" is known and relates to a heterogeneous fluid of an internal phase (i.p.) that is a solid and an external phase (e.p.) that is a liquid. The external phase comprises one or more dispersants/surfactants, optionally one or more solvents and optionally one or more pre-polymers.

The term "polymer" is known and includes organic and inorganic synthetic materials. The term "pre-polymer" shall include both, monomers and oligomers.

The term "solution-processing" is known in the field and denotes the application of a coating or thin film to a substrate by the use of a solution-based (=liquid) starting material. In the context of the present invention, solution processing relates to the fabrication of commercial products, such as electronic devices, optical devices, and articles comprising (decorative) coatings and also to the fabrication of components/intermediate goods comprising a QD composite or QD layer. Typically, the application of the suspension(s) is/are conducted at ambient conditions.

The term "QD composite" denotes a solid inorganic/organic composite material comprising LCs/QD, surfactant and a matrix. The form of a QD composite includes films, fibers and bulk material. QD composites are used for applications where the LCs/QD's only have an optical function, as the LCs/QD's are not electronically addressed.

In QD composites, the LCs/QD's are embedded in a matrix, such as a polymer matrix or an inorganic matrix, in order to spatially separate the LCs/QD's from each other. Depending on the use, the thickness of a QD composite film may vary over a broad range, but typically is 1-1000 microns.

The term "QD layer" denotes a thin layer comprising luminescent crystals (specifically QDs) and surfactant and are free of, or essentially free of additional components, such as matrix/binder. QD layers may find various applications, including quantum dot light emitting diodes (QLED) or quantum dot solar cells. In these applications, the LCs/QDs are electronically addressed; a current flows through the QD-layer by applying a voltage. Depending on the use, the thickness of a QD layer may vary over a broad range, but typically is 3-200 nm, preferably 5-100 nm, most preferably 6-30 nm. A QD layer can be composed of a monolayer of LCs/QDs, thus having a thickness equal to the size of the LCs/QDs used and thus defining a lower limit of the thickness.

The present invention will be better understood by reference to the figures.

FIG. 1(a) depicts the relationship of the various aspects of the present invention, namely, the method for manufacturing luminescent crystals, specifically quantum dots ($1^{st}$ aspect); ink compositions ($2^{nd}$ aspect); a solid polymer composition ($3^{rd}$ aspect); component ($4^{th}$ aspect); device ($5^{th}$ aspect); method for manufacturing of a polymer composition ($6^{th}$ aspect); a method for manufacturing a component ($7^{th}$ aspect); and method for manufacturing a device ($8^{th}$ aspect). In FIG. 1b, x-axis shows particle size/nm, y axis shows number of particles/arbitrary unit. Left is the starting material (bulk material) provided in step (a), right are the inventive LC/QD obtained in step (b) of this invention.

Figure 4A:
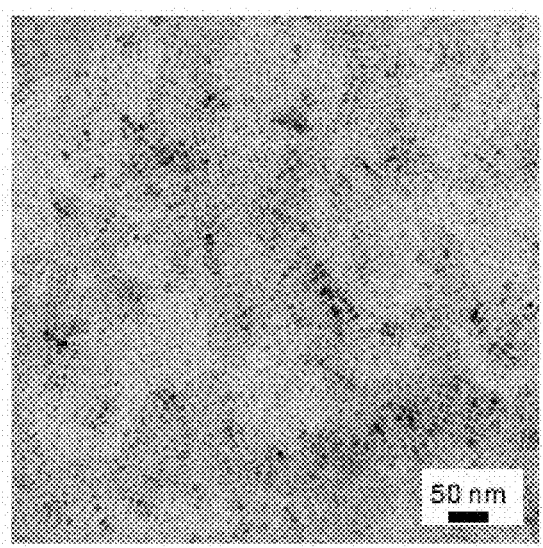
Figure 4B:
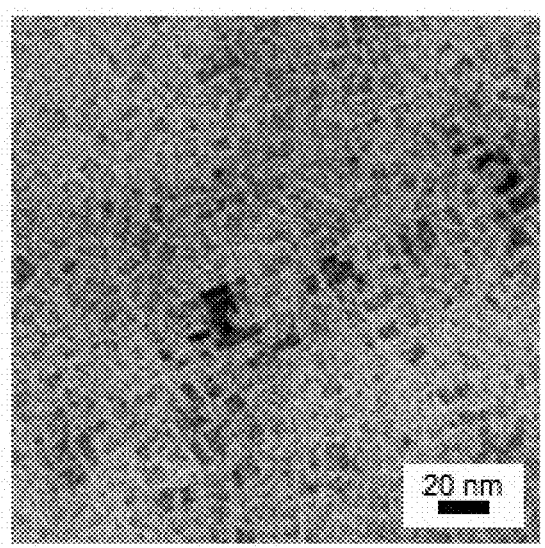

FIGS. 4a and 4b show TEM images of $FAPbBr_3$ LCs, scale 50 nm and 20 nm, respectively, synthesized according to the present invention.

Figure 5:
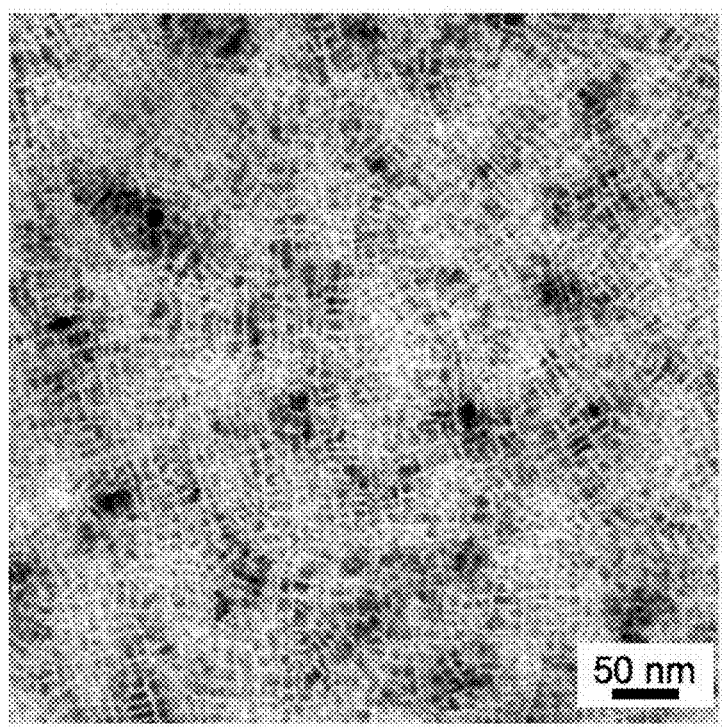

FIG. 5 shows a TEM image of $Cs_{0.85}FA_{0.15}PbBr_3$ LCs synthesized according to the present invention.

Figure 6:
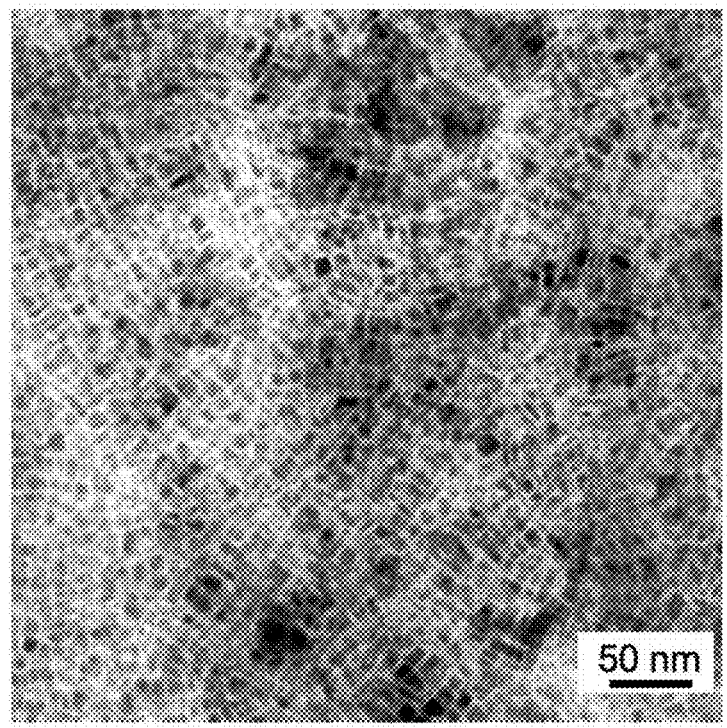

FIG. 6 shows a TEM image of $Cs_{0.5}FA_{0.5}PbBr_3$ LCs synthesized according to the present invention.

Figure 7:
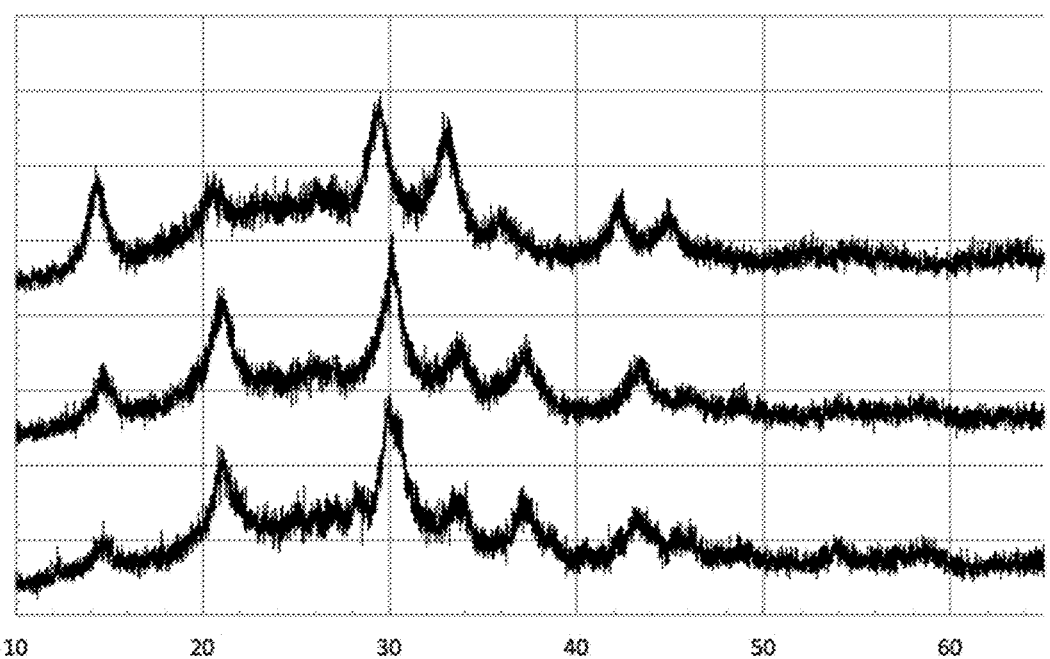

FIG. 7 shows X-ray diffraction patterns of different precipitated LCs according to the present invention. X-axis: 2theta)(°; y axis: intensity (arb. units); top: $CsPbBr_3$; middle: $Cs_{0.5}FA_{0.5}PbBr_3$; bottom: $FAPbBr_3$.

In a first aspect, the invention relates to a method for manufacturing luminescent crystals, specifically luminescent crystals from the class of quantum dots. More specifically, the invention relates to a method for manufacturing luminescent crystals of 3-500 nm size, preferably 3-100 nm size, said luminescent crystals being selected from compounds of formula (I)

$$[M^1A^1]_a M^2{}_b X_c \qquad (I),$$

wherein

A$^1$ represents one or more organic cations, preferably selected from the group consisting of formamidinium, ammonium, guanidinium, protonated thiourea, imidazolium, pyridinium, pyrrolidinium, M$^1$ is optional, and if present, represents one or more alkaline metals, preferably selected from Cs, Rb, K, Na, Li, M$^2$ represents one or more metals other than M$^1$, preferably selected from the group consisting of Ge, Sn, Pb, Sb, and Bi, X represents one or more anions selected from the group consisting of halides and pseudohalides and sulfide, preferably: chloride, bromide, iodide, cyanide, thiocyanate, isothiocyanate and sulfide, particularly preferably one or more halides selected from the group consisting of Cl, Br, and I, a represents 1~4 b represents 1-2 c represents 3-9;

said method comprising the steps of (a) providing a solid material as defined below; and (b) dispersing said material in the presence of a liquid as defined below.

This aspect of the invention shall be explained in further detail below.

It is known that LCs/QDs are materials sensitive to the environment. First they tend to aggregate what induces the non-radiative recombination paths, leading to reduced luminescence quantum yield. Accordingly, measures have to be taken to stabilize the LCs/QDs once synthesized. The method described herein meets with this requirement by disclosing an improved manufacturing method to provide LCs/QDs in the form of a stable suspension ("ink").

The method described herein may be considered a "top down" approach, as material is first conventionally synthesized and then reduced in size and stabilized to obtain LCs/QDs. This approach is opposite to what is known and described in Protesescu and Aygüler (discussed above), which is a "bottom up" approach. The inventive method is further illustrated, but not limited by the experiments provided below.

The method described herein provides LCs/QDs having excellent properties. First, small FWHM values (Width of the emission peak; e.g. 26 nm for emission at 522 nm) are observed. Second, high luminescence quantum yields are observed (>80% for emission at around 530 nm). These quantum yields are high when compared to the 5-15% as reported in Aygüler (cited above). Accordingly, the LCs/QDs provided by the inventive method are suited for a large number of applications in electronic and optical devices. Further, the LCs/QDs provided by the inventive method are also suited for coating (non-electronic/non-optical) articles, such as a decorative coating.

The inventive method is superior, when compared to known manufacturing methods. First, it is much more robust and can be easily up-scaled. Second, it requires less starting materials and produces less by-products. Third, no solvent exchange to low-boiling solvents (e.g. toluene) is required after the LCs/QDs synthesis because the synthesis can directly take place in low-boiling solvents. Forth, narrow size distribution of the products obtained is observed. As a result, the manufacturing costs are significantly reduced, making LCs/QDs available for a large number of applications.

Luminescent Crystals/Quantum Dots of formula (I): The inventive method provides for LCs/QDs having an average size of 3-500 nm, in particular of 3-100 nm. The LCs/QDs further have a narrow size distribution, as indicated by the low FWHM values of the emission peaks.

In one embodiment, the invention relates to LCs/QDs of formula (I), where a=1, b=1, c=3.

As can be seen from the above formula (I), the compounds subject to this invention are hybrid materials in that they contain two types of cations, namely organic and metallic cations. While cation A$^1$ is an organic cation, cation M$^2$ (and M$^1$, if present) is a metal cation. According to this invention, organic cations A$^1$ are present in a compound of formula (I), while metallic cations M$^1$ may or may not be present (A$^1$≠0; M$^1$≠0 or M$^1$≠0)). Such hybrid materials, particularly in the form of Perovskite Nanoparticles, have beneficial properties. A broad range of hybrid materials (I) comprising organic cations A$^1$ are available following the inventive manufacturing method. Suitable organic cations may be selected from the group consisting of formamidinium cations (IV-1), ammonium cations (IV-2), guanidinium cations (IV-3), protonated thiourea cations (IV-4), imidazolium cations (IV-5), pyridinium cations (IV-6), pyrrolidinium cations (IV-7),

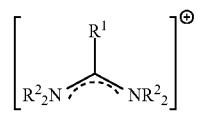

(IV-1)

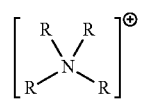

(IV-2)

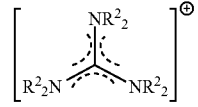

(IV-3)

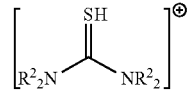

(IV-4)

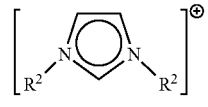

(IV-5)

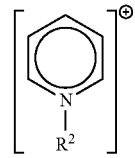

(IV-6)

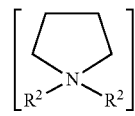

(IV-7)

wherein the substituents R represents, independent from each other, hydrogen, or C$_{1-4}$ alkyl, or phenyl, or benzyl and in case R is connected to carbon it additionally represents independent from each other halide or pseudohalide.

For (IV-1), R$^2$ preferably represents hydrogen; and R$^1$ preferably represents methyl or hydrogen or halide or pseudohalide. Preferred cations are selected from the group consisting of the acetamidinium, formamidinium (FA). FA is the preferred cation.

For (IV-2), R preferably represents hydrogen and methyl, ethyl, n-propyl, isopropyl, n-butyl, iso-butyl, tert-butyl, phenyl, benzyl. Preferred cations are selected from the group consisting of benzylammonium, iso-butylammonium, n-butylammonium, t-butylammonium, diethylammonium, dimethylammonium, ethylammonium, methylammonium (MA), phenethylammonium, iso-propylammonium, n-propylammonium. MA is the preferred cation.

For (IV-3), $R^2$ preferably represents hydrogen, resulting in the parent compound, the guanidinium cation.

For (IV-4), $R^2$ preferably represents hydrogen, resulting in the parent compound, the protonated thiourea cation.

For (IV-5), $R^2$ preferably represents methyl or hydrogen. Imidazolium is the preferred cation.

For (IV-6), $R^2$ preferably represents methyl or hydrogen. Pyridinium is the preferred cation.

For (IV-7), $R^2$ preferably represents methyl or hydrogen. Pyrrolidinium is the preferred cation.

It is understood that according to the invention the presence of $A^1$ is mandatory. The compounds of formula (I) according to this invention are therefore termed organic perovskites.

The amount of $M^1$ may vary over a broad range. In one embodiment, the invention relates to LCs/QDs of formula (I), where no $M^1$ is present. In this embodiment, the invention relates to compounds of formula (I-2)

$$A^1_a M^2_b X_c \quad (I\text{-}2)$$

where the substituents are as defined herein. In this specification, such compounds of formula (I-2) are termed pure organic perovskites, due to the absence of $M^1$.

In one further embodiment, the invention relates to LCs/QDs of formula (I), where $M^1$ is present up to 90 mol % when calculated on the basis of $M^1+A^1$. In this embodiment, $M^1$ and $A^1$ are statistically distributed and relate to compounds of formula (I-3)

$$[M^1_{a'}A^1_{a''}]_a M^2_b X_c \quad (I\text{-}3)$$

where
a'+a"=1 and a'/(a'+a")<0.9 and a'>0, and
where the remaining substituents are as defined herein. In this specification, such compounds of formula (I-3) are termed inorganic-organic perovskites, due to the presence of $M^1$.

In one embodiment, the invention relates to LCs/QDs of formula (I), where $M^1$=Cs.

In one embodiment, the invention relates to LCs/QDs of formula (I), where $A^1$=FA.

In one embodiment, the invention relates to LCs/QDs of formula (I), where $M^2$=Pb.

In one embodiment, the invention relates to LCs/QDs of formula (I), where X is a combination of at least two elements selected from the list of Cl, Br, I.

In one embodiment, the invention relates to LCs/QDs of formula (I), selected from $FAPBX_3$, particularly $FAPbBr_3$, $FAPbBr_2I$. This embodiment also includes corresponding molar mixtures of FABr and $PbBr_2$ or mixtures of FAI and $PbBr_2$.

In one further embodiment, the invention relates to LCs/QDs of formula (I) further including doped materials, i.e. wherein part of $M^1$ is replaced by other alkaline metals, or wherein part of $M^2$ is replaced by other transition metals or rare earth elements, or wherein part of X is replaced by other halogenides, or wherein part of $A^1$ is replaced by other cations as defined herein. Dopants (i.e. replacing ions) are generally present in an amount of less than 1% in respect to the ion they are replacing.

In one further embodiment the invention relates to LCs/QDs of formula (I-2), selected from $A^1SnX_3$, $A^1_3Bi_2X_9$, $A^1GeX_3$.

The compounds of formula (I) include stoichiometric and non-stoichiometric compounds. Compounds of formula (I) are stoichiometric, in case a, b and c represent a natural number (i.e. positive integers); they are non-stoichiometric, in case a, b and c represent a rational number, excluding natural numbers.

In one further embodiment the invention relates to LCs/QDs of formula (I) wherein part of X is replaced by one or more anions selected from the group consisting of cyanide, thiocyanate, isothiocyanate and sulfide. As exemplary embodiments are identified $$A^1_a M^2_b X^1_{c'} X^2_{c''} \quad (I\text{-}1),$$

wherein
$A^1$, $M^2$, a, b are as identified above;
$X^1$ represents one or more anions selected from the group of halides as identified above;
$X^2$ represents an anion different from $X^1$, selected from the group of pseudohalides or sulfide, as identified above;
c'+c" represents a natural number from 3 to 9 and c'/c">0.9. As sulfide is 2-, it counts twice when calculating c', c".

Exemplary embodiments of formula (I-1) include $FAPbCl_{2.9}CN_{0.1}$, $FASnBr_2(SCN)$, $FA_3Bi_2Br_{8.8}(NCS)_{0.2}$, and $FAPbBr_{0.43}I_{2.43}S_{0.07}$.

Step (a): Suitable Solid material provided in step (a) has an average particle size of at least 100 nm and a polydisperse size distribution, typically 50 nm-100 µm, more typically 100 nm-50 µm. The particle size of the solid material shall be determined by SEM, TEM, BET or centrifugal sedimentation method. Further, such solid material has a chemical composition that corresponds to the chemical composition of the desired LCs/QDs. Accordingly, such solid material has a stoichiometric composition of a moles ($A^1+M^1$), b moles $M^2$ and c moles X.

Such material may be provided to the inventive process by different approaches, e.g. (a1), (a2), (a3) as outlined below. The material may be provided to step (b) either continuously or discontinuously by known methods. The material may be provided to step (b) either as a solid material, or in the form of a suspension.

Wet synthetic process (a1): Manufacturing of solid material according to formula (I) is known per se. The most common methods include wet synthetic processes such as precipitation processes from a solvent based or aqueous phase. The material may be provided to step (b) either continuously or discontinuously by known methods.

Dry synthetic process by milling (a2): A further approach for manufacturing of solid material according to formula (I) includes dry milling of precursor materials. In this embodiment, the solid material is a mixture of two or more dry precursors having the formulae $aA^1_1X_1$ and $M^2_bX_{(c-a)}$, where the substituents are defined above. For example, $FAPbBr_3$, $FA_4PbBr_6$, are accessible by corresponding molar mixtures of the precursors FABr and $PbBr_2$ or $FAPbBr_2I$ being accessible by corresponding mixtures of precursors FAI and $PbBr_2$. The dry crystalline material according to formula (I) is then obtained in a dry milling process, e.g. using a pestle and mortar or a process including agitated milling balls. This process can be regarded as a solid state reaction induced by milling.

This approach may be considered "top-down": Solid starting materials available by dry milling exhibit a polydisperse particle size distribution with an average particle size of >500 nm, typically between 1-50 microns (measured by SEM or centrifugal sedimentation method) whereas synthesized luminescent crystals exhibit a very narrow size distribution with an average size of 3-500 nm. By following the methods described herein, the average particle size and polydispersity of the starting material is reduced in order to obtain a narrow size distribution and a particle size of 3-500 nm.

In situ formation (a3): A further alternative for a solid material according to formula (I) includes in situ formation, such as solid state reaction during the dispersing process. In this embodiment, the solid material is a mixture of two or more dry precursors having the formulae $aA^1{}_1X_1$ and $M^2{}_bX_{(c-a)}$, where the substituents are defined above. For example, $FAPbBr_3$, $FA_4PbBr_6$, are accessible by corresponding molar mixtures of the precursors FABr and $PbBr_2$ or $FAPbBr_2I$ being accessible by corresponding mixtures of precursors FAI and $PbBr_2$. The crystalline material according to formula (I) is then formed during the dispersing process (i.e. in situ) by reaction of the two precursors of the solid material.

The above precursors, in turn, are available by known methods, such as wet synthetic processes, dry synthetic processes. The skilled person is in a position to select suitable precursors to obtain luminescent crystals of formula (I). Again, this approach may also be considered "top-down", as the precursors used are larger than the LCs/QDs obtained.

In one embodiment the average particle size of the solid material is at least 100 nm (determined by BET, SEM, TEM or centrifugal sedimentation method), preferably between 100 nm-100 µm, more preferably 500 nm-50 µm.

In an advantageous embodiment, the solid material consists of a single composition having the same stoichiometry as the final LCs/QDs of formula (I).

Step (b): Without being bound to theory, it is believed that upon dispersion of the starting material in the liquid phase a number of effects occur simultaneously or subsequently.

First, the solid material is evenly distributed within the liquid phase.

Second, the solid material is contacted with the surfactant. It is believed that the material is thereby coated and stabilized in the liquid phase.

Third, the particle size of the solid material is reduced. Without being bound to theory it is believed that a monodisperse particle size distribution is obtained by two occurring mechanisms: (1) mechanical crushing/cleaving of particles larger than the final LCs/QD size, (2) Ostwald ripening and sintering of particles smaller than the final LCs/QD size.

In a specific embodiment, the average particle size of the solid starting material is at least 1.5 times (preferably at least 2 times, most preferably at least 5 times) higher than the average particle size of the correspondingly synthesized LCs/QDs.

Liquid: As outlined above, step (b) is performed in a liquid phase. Suitable liquids may be selected from (i) liquid surfactants, (ii) a combination of (liquid or solid) surfactant and solvent, (iii) a combination of (liquid or solid) surfactant, solvent and (liquid or solid) pre-polymer or polymer and (iv) a combination of (liquid or solid) surfactant and liquid pre-polymer.

In embodiment (i), the liquid phase consists of (or essentially consists of) liquid surfactants. This embodiment is advantageous, as it is a simple system without the use of solvents.

In embodiment (ii), the liquid phase consists of (or essentially consists of) a combination of (liquid or solid) surfactant and solvent(s). This embodiment is advantageous, as it allows the use of solid surfactants.

In embodiment (iii), the liquid phase consists of (or essentially consists of) a combination of (liquid or solid) surfactant, solvent(s) and (liquid or solid) pre-polymer or polymer. This embodiment is advantageous, as it provides a composition that may be directly used for manufacturing components/intermediates as defined below.

In embodiment (iv), the liquid phase consists of (or essentially consists of) a combination of (liquid or solid) surfactant and liquid pre-polymer. This embodiment is advantageous, as it provides a composition that is free of solvents and that may be directly used for manufacturing components/intermediates as defined below.

Solvent: The term solvent is defined above. For avoidance of doubt, the term solvent does neither include surfactants nor pre-polymers.

Advantageously, the solvent is selected from the group of hydrocarbons (including linear, branched and cyclic hydrocarbons), aromatic hydrocarbons, ethers (including glycol-ethers), esters, alcohols, ketones. Preferably the solvent is selected from the group of $C_{5-8}$ cycloalkanes, linear and branched $C_{5-24}$ alkanes, said alkanes being unsubstituted or substituted by phenyl or naphtyl. Most preferably, the solvent is selected from the group of linear $C_{5-15}$ alkanes, toluene and cyclohexane.

In a further embodiment the solvent exhibits a boiling point below 140° C., preferably below 120° C. As a beneficial aspect of the inventive method, it is now possible to obtain LCs/QDs at much lower temperature when compared to previous methods, such as Protesescu (discussed above, using synthesis methods of 140-200° C.).

Pre-Polymer: The term pre-polymer is defined above. Advantageously, the pre-polymer is selected from the group of acrylates, carbonates, sulfones, epoxies, vinyls, urethanes, imides, esters, furanes, melamines, styrenes, and silicones. Preferably, the pre-polymer is selected from the group of acrylates, urethanes, styrenes, epoxies. Particularly preferably, the pre-polymer is selected from the group consisting of acrylates, and epoxies.

Acrylate pre-polymers preferably comprise or consist of units of formula (III)

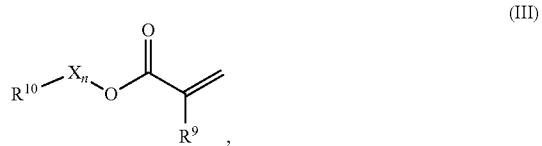

(III)

wherein:
$R^9$ represents H or $CH_3$,
$R^{10}$ represents a cyclic, linear or branched $C_{1-25}$ alkyl, or a cyclic, linear or branched $C_{2-25}$ alkenyl group, or a $C_{6-26}$ aryl group, each optionally substituted with one or more cyclic, linear or branched $C_{1-20}$ alkyl, phenyl or phenoxy,
n represents 0 or 1, and
X represents a spacer from the group of alkoxylates comprising 1-40 carbon atoms and 1-10 oxygen atoms.
X preferably represents a spacer of formula (IIIa),

(IIIa)

wherein:

x represents 1-10, preferably 1, 2, 3, or 4.

y represents 0, 1, 2, 3 or 4, preferably 2.

Thus, compounds of formula (III) include acrylate pre-polymers of formulae (III-1) and (III-2) where $R^9$ is H, and Methacrylate pre-polymers of formula (III-3) and (III-4) where $R^9$ is Methyl, collectively also termed (Meth)acrylate pre-polymers.

Further, compounds of formula (III) also include simple (meth)acrylate pre-polymers where n is 0 and X is not present (formulae (III-1) and (III-3) and alkoxylated (meth) acrylate pre-polymers (formulae (III-2) and (III-4)).

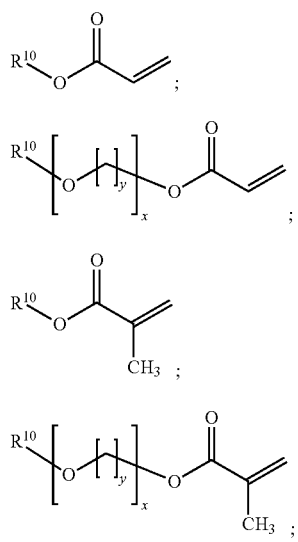

R represents an aliphatic group either saturated or unsaturated group selected from the group of cyclic, linear or linear branched molecules, or an aromatic group.

Acrylate pre-polymers include monomers and partially reacted oligomers of formula (III).

$R^{10}$ preferably represents a cyclic, linear or branched $C_{1-25}$ alkyl. Cyclic alkyl includes mono-cyclic and poly-cyclic groups and also includes optionally substituted groups, comprising 1-6 substituents from the group of $C_{1-4}$ alkyl. $R^{10}$ particularly preferably represents methyl, ethyl, propyl, butyl, octyl, lauryl, cetyl, stearyl, 2-ethylhexyl, isooctyl, isodecyl, cyclohexyl, trimethyl-cyclohexyl, isobornyl, dicyclopentenyl.

$R^{10}$ further preferably represents a cyclic, linear or branched $C_{2-25}$ alkenyl group. $R^{10}$ particularly preferably represents allyl, oleyl, $R^{10}$ further preferably represents a $C_{6-26}$ aryl group, optionally substituted with one or more cyclic, linear or branched $C_{1-20}$ alkyl. Aryl includes mono-cyclic and poly-cyclic aryls which may optionally be substituted by 1-4 substituents, said substituents being selected from the group of $C_{1-4}$ alkyl, phenyl and phenoxy. $R^{10}$ particularly preferably represents phenyl, benzyl, 2-naphtyl, 1-naphtyl, 9-fluorenyl.

Specific examples of acrylate pre-polymers of formula (III-1) include: isobornylacrylate and dicyclopentadienyl-acrylate (CAS 33791-58-1).

Specific examples of acrylate pre-polymers of formula (III-2) and (III-4) include: poly(ethylene glycol) phenyl ether acrylates (specifically 2-phenoxyethyl acrylate), O-phenyl phenoxyethyl acrylate, Polyethylene glycol o-phenylphenyl ether acrylate (CAS 72009-86-0), poly(ethylene glycol) ethyl ether methacrylate, Di(ethylene glycol) ethyl ether acrylate, Poly(ethylene oxide) nonylphenyl etheracrylate, Poly(propylene glycol) 4-nonylphenyl ether acrylate, Ethylene glycol dicyclopentenyl ether acrylate, Ethylene glycol dicyclopentenyl ether methacrylate.

Due to the definition of $R^{10}$, (meth)acrylate pre-polymers of formula (III) are mono-functional.

In a further embodiment, the (meth)acrylate pre-polymers are multifunctional (meth)acrylate pre-polymers. Such multifunctional (meth)acrylate pre-polymers are obtainable in case (meth)acrylic acid is reacted with a polyol to thereby obtain di-, tri-, tetra-, penta- and hexafunctional (meth) acrylate pre-polymers. Suitable polyols for forming multifunctional (meth)acrylate pre-polymers include aliphatic or aromatic $C_{1-30}$ polyols, optionally substituted with one or more $C_{1-4}$alkoxy groups, wherein the number of alkoxy groups is preferably ≤10, more preferably ≤5. Examples of polyols include, glycole, hexanediol, decanediol, bisphenol, fluorene-9-bisphenol, ethoxylated bisphenol comprising 2-6, e.g. 4 ethoxy-groups and ethoxylated fluorene-9-bisphenol comprising 2-6, e.g. 4, ethoxy-groups.

Specific examples of difunctional (meth)acrylate pre-polymers include 1,10-decanediol diacrylate, 1,6-hexanediol diacrylate, 1,6-hexanediol dimethacrylate, Neopentyl glycol dimethacrylate, tricyclodecane dimethanol diacrylate, Bisphenol A ethoxylate diacrylate (including CAS 64401-02-1), Bisphenol A ethoxylate dimethacrylate, modified fluorene-9-bisphenol diacrylate, modified fluorine-9-bisphenol dimethacrylate, 1,3-butylene glycol dimethacrylate.

Specific examples of trifunctional (meth)acrylate pre-polymers include Ethoxylated trimethylolpropane triacrylate (CAS 28961-43-5), trimethylolpropane triacrylate (CAS 15625-89-5), trimethylolpropane trimethacrylate (CAS 3290-92-4).

Specific examples of tetrafunctional (meth)acrylatepre-polymers include Di(trimethylolpropane) tetraacrylate (CAS 94108-97-1), Pentaerythritol tetraacrylate (CAS 4986-89-4).

Specific examples of hexafunctional (meth)acrylate pre-polymers include Dipentaerythritol hexaacrylate (CAS 29570-58-9).

Among the above discussed mono- or multifunctional (meth)acrylate pre-polymers are particularly preferred, provided:

$R^{10}$ represents a cyclic $C_{5-25}$ alkyl group, or $R^{10}$ represents a cyclic $C_{5-25}$ alkenyl group, or $R^{10}$ represents a substituted aryl group.

Among the above discussed mono- or multifunctional (meth)acrylate pre-polymers, very particularly preferred are compounds where $R^{10}$ represents isobornyl; dicyclopentenyl; bisphenol or fluoren-9-bisphenol.

Polymer: The term polymer is defined above. Advantageously, the polymer is selected from the group of acrylate polymers, carbonate polymers, sulfone polymers, epoxy polymers, vinyl polymers, urethane polymers, imide polymers, ester polymers, furane polymers, melamine polymers, styrene polymers and silicone polymers and cyclic olefin copolymers.

The term acrylate polymers relates to polymers comprising or consisting of repeating units described above.

Acrylate polymers include homo- and co-polymers. Acrylate co-polymers preferably comprise 50-100 wt. % of repeating units according to formula (III), particularly preferably 90-100 wt %. Acrylate homo-polymers comprise one or more, preferably one repeating unit of formula (III).

Surfactant: A broad variety of surfactants may be used in the context of the present invention. Suitable surfactants may be determined in routine experiments; its choice depends mainly on the polymer used in the next step and the nature of solid material. Surfactants may be selected from the class of non-ionic surfactants, cationic surfactants, zwitterionic surfactants and anionic surfactants.

In one embodiment, the surfactants are selected from the group of anionic, cationic, non-ionic and zwitter-ionic surfactants, having one or more chemical moieties selected from the group of alkyl ethers with the formula (II)

$$RO—(C_2H_4O)_m(C_3H_6O)_n— \quad (II),$$

wherein m and n independently are 0-10, but m+n>2 and

R represents $C_{1-5}$-alkyl.

It is known in the art to combine two or more surfactants to improve positive properties; such combination of surfactants being also subject to the present invention.

In a further embodiment, the surfactants comprise a mixture of a zwitter-ionic surfactant and a non-ionic surfactant, preferably a saturated or unsaturated fatty amine.

Non-ionic surfactants include: maleic polymers such as Poly(maleic anhydride-alt-1-octadecene), polyamines, alkylamines, (e.g. N-alkyl-1,3-propylene-diamines, N-alkyldipropylene-triamines, N-alkyltripropylene-tetraamines, N-alkylpolypropylene-polyamines,) poly-(ethyleneimine), polyesters, alkyl esters (e.g. cetyl palmitate), alkyl polyglycol ethers (such as fatty alcohol polyglycol ether with 3-25 ethoxy units (EO), e.g. Dehypon E124) and oxoalcohol polyglycolether), mixed alkyl/aryl polyglycolethers, alkyl polyglucosides (APGs), fatty alcohols, such as stearyl alcohols (e.g. Lorol C18TM), N-acylamides (e.g. N-oleoyl-gamma-aminobutyric acid)

Non-ionic surfactants further include polymeric ethoxylate and/or propoxylate (EO/PO) adduct surfactants, such as fatty alcohol alkoxylates, alcohol EO/PO adducts (including fatty alcohol EO/PO adducts, oxo alcohol EO/PO adducts), EO/PO block-copolymers, ethylene diamine ethylene oxide-propylene oxide (EO/PO) block-copolymers, endcapped (fatty) alcohol EO adducts and EO/PO adducts (e.g. butyl endcapped), esters of carboxylic acids, in particular EO/PO adducts and sorbitan esters (e.g. from the group of SPAN).

Non-ionic surfactants further include alkoxy-silanes and hydrolyzed products thereof.

Non-ionic surfactants further include alkylphosphines, alkylphosphine oxides (e.g. trioctylphosphine oxide—TOPO) and alkylthiols.

Non-ionic surfactants further include alkyl esters of fatty acids (e.g. cetyl palmitate, lauric acid, capric acid).

A preferred class of non-ionic surfactants are alkylimines alkylamines, e.g. dioctylamine, oleylamine, octadecylamine, hexadecylamine.

Cationic surfactants include: alkylammonium halides, e.g. oleylammonium bromide, alkyltrimethylammonium halides e.g. cetyltrimethylammonium bromide, dialkyldimethylammonium halides such as e.g. distearyldimethylammonium chloride, trialkylmethylammonium halides e.g. trioctylmethylammonium chloride, diquarternary polydimethylsiloxanes.

Zwitterionic surfactants, also called amphoteric surfactants, are a known class of compounds. They consist of a cationic part, preferably an amine salt, a quaternary ammonium group, sulfonium or phosphonium and an anionic part preferably a carboxylate, sulfonate, sulfite, sulfate, phosphinate, phosphonate, phosphite or phosphate group. Zwitterionic surfactants most preferably comprise quaternary ammonium as the cationic part and carboxylate, sulfonate or phosphonate as the anionic part. Examples of zwitterionic surafctants include: betaines, such as caprylic glycinate, cocamidopropylbetain, and disodium cocoampho diacetate; 3-(N,N-dimethylalkylammonio)propane sulfonate, alkylphospoazanium zwitterion.

Specific groups of zwitterionic surfactants include:
Ammonium carboxylates according to formula (V-1),
Ammonium derivatives according to formulae (V-2),
Phosphocholines according to formula (V-3),
1-Ammonium-2-propanol derivatives of formula (V-4),
Amidoalkyl ammonium carboxylates of formula (V-5),
Amidoalkyl ammonium derivatives of formula (V-6), and
1-(Amidoalkyl-ammonium)-2-hydroxy-propyl derivatives of formula (V-7).

Ammonium carboxylates according to formula (V-1),

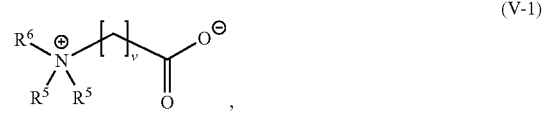

wherein:

$R^5$ is H or methyl, v is 1-8, and $R^6$ is an apolar tail, selected from substituted or unsubstituted hydrocarbons.

$R^6$ is preferably selected from the group of alkyl, alkoxy-alkyl, aryl-alkyl, aryloxy-alkyl, and alkenyl.

$R^6$ is particularly preferably selected from linear or branched alkyl, more preferably a linear or branched $C_{8-30}$ alkyl, most preferably $C_{10-20}$alkyl.

v preferably represent an integer from 1-4.

Specific subgroups of ammonium carboxylates according to (V-1) include glycinates where $R^5$ is H and v is 1, dimethyl ammonium betaines where $R^5$ is $CH_3$ and v is 1, and ammonium propionates where $R^5$ is H and v is 2).

Ammonium derivatives according to formula (V-2),

wherein:

$R^5$, $R^6$ and v are as defined in formula (V-1), and

FG represents a negatively charged functional group.

FG preferably is selected from the group consisting of sulfonate (end group —$SO_3^-$), sulfite (end group O—$SO_2^-$), sulfate (end group —O—$SO_3^-$), phosphonate (end group —P(OR$^7$)$O_2^-$), phosphinate (end group —PR$^7O_2^-$), phosphate (end group —O—P(OH)$O_2^-$) and phosphite (end group —O—P(H)$O_2^-$).

$R^7$ is preferably selected from the group of alkyl, alkoxy-alkyl, aryl-alkyl-, aryloxy-alkyl-, and alkenyl.

$R^7$ is particularly preferably selected from linear or branched alkyl, more preferably a linear or branched $C_{8-30}$ alkyl, most preferably $C_{10-20}$alkyl.

A preferred subgroup are ammonium sulfonates according to formula (V-2.1),

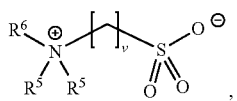
(V-2.1)

wherein:
$R^5$, $R^6$ and v are as defined in formula (V-2).

Specific subgroups of ammonium sulfonates according to formula (V-2.1) include sulfobetaines wherein $R^5$ is $CH_3$).

A further preferred subgroup are Ammonium sulfites according to formula (V-2.2),

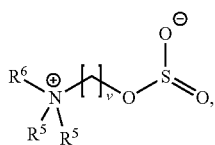
(V-2.2)

wherein:
$R^5$, $R^6$ and v are as defined in formula (V-2).

Specific subgroups of ammonium sulfites according to formula (V-2.2) include sulfitobetaines wherein $R^5$ is $CH_3$.

A further preferred subgroup are ammonium sulfates according to formula (V-2.3),

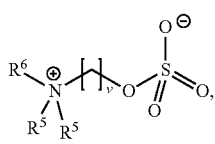
(V-2.3)

wherein:
$R^5$, $R^6$ and v are as defined in formula (V-2).

Specific subgroups of ammonium sulfates of formula (V-2.3) include sulfatobetaines wherein $R^5=CH_3$.

A further preferred subgroup are ammonium phosphonates according to formula (V-2.4),

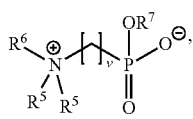
(V-2.4)

wherein:
$R^5$, $R^6$, $R^7$ and v are as defined in formula (V-2), and

Specific subgroups of ammonium phosphonates according to formula (V-2.4) include phosphonatebetaines where $R^5$ is $CH_3$.

A further preferred subgroup are ammonium phosphinates according to formula (V-2.5),

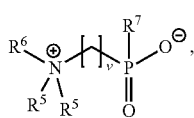
(V-2.5)

wherein:
$R^5$, $R^6$, $R^7$ and v are as defined in formula (V-2).

Specific subgroups of ammonium phosphinates according to formula (V-2.5) include phosphinatebetaines where $R^5=CH_3$.

A further preferred subgroup are ammonium phosphates according to formula (V-2.6),

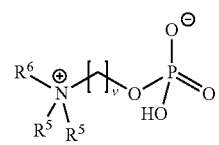
(V-2.6)

wherein:
$R^5$, $R^6$ and v are as defined in formula (V-2).

Specific subgroups of ammonium phosphates according to formula (V-2.6) include phosphatobetaines where $R^5=CH_3$.

A further preferred subgroup are ammonium phosphites according to formula (V-2.7),

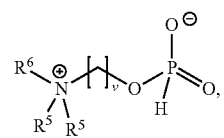
(V-2.7)

wherein:
$R^5$, $R^6$ and v are as defined in formula (V-2).

Specific subgroups of ammonium phosphites according to formula (V-2.7) include phosphitobetaines where $R^5=CH_3$.

Phosphocholine derivatives according to formula (V-3),

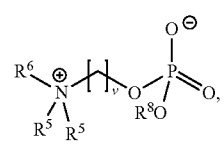
(V-3)

wherein:
v is 1-8, preferably 1-4, particular preferably 2, $R^5$ is as defined in formula (V-1), $R^6$ is hydrogen or methyl, and $R^8$ is an apolar tail, selected from substituted or unsubstituted hydrocarbons.

$R^8$ is preferably selected from the group of alkyl, alkoxy-alkyl, aryl-alkyl-, aryloxy-alkyl-, and alkenyl.

$R^8$ is particularly preferably selected from linear or branched alkyl, more preferably a linear or branched $C_{8-30}$ alkyl, most preferably $C_{10-20}$ alkyl.

Specific subgroups of phosphocholines according to formula (V-3) include phosphitobetaines where $R^5$ and $R^6$ are $CH_3$. A specific example is miltefosine.

1-Ammonium-2-propanol-derivatives of formula (V-4),

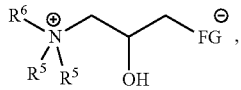
(V-4)

wherein:

R$^5$ and R$^6$ are as defined in formula (V-1), and

FG represents a negatively charged functional group.

FG preferably is selected from the group consisting of sulfonate (end group —SO$_3^-$), sulfite (end group O—SO$_2^-$), sulfate (end group —O—SO$_3^-$), phosphonate (end group —P(OR$^7$)O$_2^-$), phosphinate (end group —PR$^7$O$_2$), phosphate (end group —O—P(OH)O$_2^-$) and phosphite (end group —O—P(H)O$_2^-$) wherein R$^7$ is defined above.

FG particularly preferably represents sulfonate. Specific subgroups of compounds of formula (V-4) include hydroxyl sulfobetaines where R$^5$ and R$^6$ is CH$_3$ and FG is —SO$_3^-$.

Amidoalkyl ammonium carboxylates of formula (V-5),

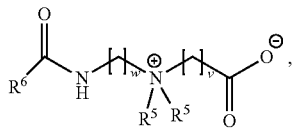
(V-5)

wherein:

R$^5$, R$^6$, and v are as defined in formula (V-1), and w is 2-5, preferably 2.

Amidoalkyl ammonium derivatives of formula (V-6),

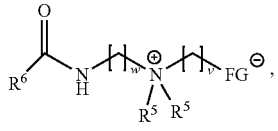
(V-6)

wherein:

R$^5$, R$^6$, and v are as defined in formula (V-1), w is 2-5, preferably 2, and FG represents a negatively charged functional group.

FG preferably represents a sulfonate (end group —SO$_3^-$), sulfites (end group O—SO$_2^-$) and sulfates (end group —O—SO$_3^-$), phosphonates (end group —P(OR$^7$)O$_2^-$), phosphinates (end group —PR$^7$O$_2$), phosphates (end group —O—P(OH)O$_2$) and phosphites (end group —O—P(H)O$_2$) and wherein R$^7$ is defined above.

FG particularly preferably represents a sulfonate. Specific subgroups of amidoalkyl ammonium sulfonates include amido alkyl sulfobetaines where R$^5$ is CH$_3$ and FG is —SO$_3^-$.

1-(Amidoalkyl-ammonium)-2-hydroxy-propyl derivatives according to formula (V-7)

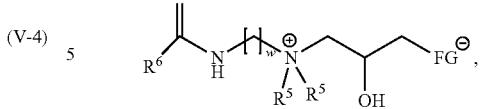
(V-7)

wherein:

R$^5$ and R$^6$ are as defined in formula (V-1), and FG represents a negatively charged functional group.

FG particularly preferably represents a sulfonate. Specific subgroups of amidoalkyl hydroxy ammonium sulfonates include amidoalkyl hydroxyl sulfobetaines where R$^5$ is CH$_3$ and FG is —SO$_3^-$.

Imidazoline-derived amphoteric surfactants: This group includes amphoacetates (mono or diacatates) and amphopropionates.

Anionic surfactants include sulfates, sulfonates, phosphates, and carboxylates. Specific examples include phosphate esters of alkyl ethers, ammonium lauryl sulfate, alkali lauryl sulfate and the related alkyl-ether sulfates e.g. alkali laureth sulfate.

A preferred class of anionic surfactants are carboxylates from the class of fatty acids, such as oleic acid, stearic acid, palmitic acid.

In a preferred embodiment the surfactant is selected from the following list: SP 13300, SP 20000, SP 24000SC, SP 41000, SP540, BYK9077, Hypermer KD1-SO-(AP), Span65, Span80, Span85, methoxy-ethoxy-ethoxy-acetic acid, oleylamine, oleic acid, stearic acid, Poly(maleic anhydride-alt-1-octadecene), oleylammonium bromide, 3-(N,N-dimethyl-octadecyl-ammonio)propane sulfonate, miltefosine and TOPO.

In a further embodiment, the surfactants are selected from the group of anionic, cationic, non-ionic and zwitter-ionic surfactants comprising apolar end-groups selected from the group of alkyl or alkyl-ether chains with 4-30, preferably 6-24, most preferably 8-20 carbon atoms.

In a further embodiment, anionic surfactants are selected from monocarboxylic acids comprising a polyether tail according to formula (II), $$R(OC_nH_{2n})_qOCH_2C(O)OH \tag{II-1}$$

wherein R is C$_{1-5}$-alkyl, q is an integer from 0 to 5 and n is an integer from 1 to 3. Five particularly preferred compounds of that class are:

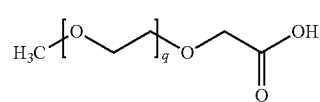
(II-1a)

wherein q is from 0-4. This corresponds to a compound of formula (II), wherein R=Methyl, n=2 and q is an integer from 0-4. A particularly preferred compound of that class is a compound of formula (II-1b),

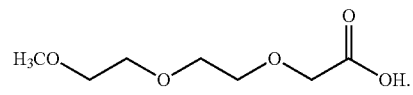
(II-1b)

Dispersing process: Suitable dispersing processes are known in the field and include dispersing methods comprising milling balls, dispersing processes by ultrasonication, dispersing by high shear mixing and high pressure dispersion. Ball milling: In a preferred embodiment, the dispersing method is ball-milling preferably by the use of an agitator ball mill. In a preferred embodiment the ball size is below 5 mm, preferably below 500 microns. In a further embodiment the dispersing method is ball-milling with a ball size between 10-1000 µm, preferably 20-500 µm. In a further embodiment the dispersing method is ball-milling with a specific power input per weight of suspension of at least 10 W/kg, preferably 100 W/kg, most preferably 1000 W/kg. In one further embodiment, the suspension temperature during the dispersing process is below 140° C., preferably below 120° C., most preferably below 70° C. It was surprisingly found that solid materials as defined above can be converted to LCs/QDs with excellent optical properties (high quantum yield, small FWHM) by the use of agitated milling balls, providing LCs/QDs with excellent properties and at low reaction temperatures. This is considered a significant advantage over the known methods.

Ultrasonication: In a further preferred embodiment, the dispersing method comprises ultrasonication, preferably with an ultrasonic horn. Particularly preferably, the dispersing method is ultrasonication with 10-100 kHz, preferably 20-30 kHz. In a further embodiment the dispersing method is ultrasonication with a specific power input per weight of suspension of at least 10 W/kg, preferably 100 W/kg, most preferably 1000 W/kg. In one further embodiment, the suspension temperature during ultrasonication is below 140° C., preferably below 120° C., most preferably below 70° C. It was surprisingly found that solid materials as defined above can be converted to LCs/QDs with excellent optical properties (high quantum yield, small FWHM) by the use of ultrasonication, providing LCs/QDs with excellent properties and at low reaction temperatures. This is considered a significant advantage over the known methods.

High shear mixing: In a further preferred embodiment, the dispersing method comprises high shear mixing, e.g. obtained with a stator/rotor configuration. Particularly preferably, the dispersing method is high-shear mixing with a shear rate of 20,000-100,000 1/s, preferably 50,000-100,000 1/s. In one further embodiment, the suspension temperature during high shear mixing is below 140° C., preferably below 120° C., most preferably below 70° C. This is considered a significant advantage over the known methods.

High pressure dispersion: In a further preferred embodiment, the dispersing method comprises high pressure dispersion also called high pressure homogenization, where impact, shear forces and cavity act as driving forces for dispersion. Particularly preferably, the dispersing method is high pressure dispersion with a pressure of 150-400 MPa, preferably 200-400 MPa. In one further embodiment, the suspension temperature during high pressure dispersion is below 140° C., preferably below 120° C., most preferably below 70° C. This is considered a significant advantage over the known methods.

The concentration of solid material provided in step (b) may vary over a broad range but is typically 100 ppm or more. In a further embodiment of the inventive method, the weight ratio solid material:liquid material (solvent+surfactant+pre-polymer (if present)+polymer (if present)) is in the range of 0.0001-0.5, preferably 0.0001-0.3, most preferably 0.0001-0.1.

The concentration of surfactant provided in step (b) may vary over a broad range, depending on its nature. In a further embodiment of the inventive method, the weight ratio surfactant:solid material is in the range of 100-0.01, preferably 50-0.015, most preferably 3-0.02.

Step (c): In a further embodiment, the as-synthesized LCs/QDs may be subject to post-processing, such as outlined below in steps (c-1) (c-2), (c-3), and (c-4).

In one embodiment of such post-processing, the halide atom X of synthesized LCs/QD's can be replaced fully or partially with other halide atoms by anion exchange. In particular alkali halides, such as CsI, RbI, NaI, KI, LiI, and lead halides, such as $PbI_2$, and organic halides such as FAI may be used for the anion exchange (c-1). This allows fine-tuning of the emission peak.

In a further embodiment of such post-processing two or more types of luminescent crystals of formula (I) are mixed. By mixing different types of luminescent crystals, e.g. by combining two suspensions comprising such LCs, the emission peak of the composition is tuned (c-4).

In a further embodiment, compositions of the present inventions may be purified from excess surfactant by diafiltration of synthesized compositions (c-2).

In a further embodiment, the LCs/QD solid content of compositions of the present inventions may be increased by diafiltration or solvent evaporation of synthesized compositions (c-3).

In a second aspect, the invention relates to a composition in the form of a suspension, also termed "ink", and its uses. This aspect of the invention shall be explained in further detail below.

Accordingly, the invention also provides for a composition in the form of a suspension comprising (i) luminescent crystals of formula (I) as described herein; (ii) surfactant as described herein but excluding octylammonium bromide, oleic acid; and (iii) optionally solvent as described herein; and (iv) optionally polymer or pre-polymer as described herein. Such compositions are novel and may be obtained by the inventive method, as described in the first aspect of this invention.

In one embodiment the invention provides for suspensions where the quantum yield thereof is >20%, preferably >50%, most preferably >70%.

In a further embodiment the invention provides for suspensions where the FWHM of LCs/QDs for visible emissions is <50 nm, preferably, <40 nm, most preferably <30 nm.

In a further embodiment the invention provides for suspensions where the FWHM of LCs/QDs having an emission peak between 480-550 nm or between 600-680 nm is <50 nm, preferably, <40 nm, most preferably <30 nm.

In a further embodiment the invention provides for suspensions where the FWHM of LCs/QDs having an emission peak between 480-550 nm is <40 nm, preferably, <30 nm, most preferably <20 nm.

The amount of components (i), (ii), (iii) and (iv) in the inventive inks may vary over a broad range and depends inter alia on its intended use and the nature of surfactant. Typically, the amount of LCs/QDs is 100 ppm or more.

In one embodiment, the weight ratio luminescent crystals (i):liquid material (ii)+(iii)+(iv) is in the range of 0.0001-0.5, preferably 0.0001-0.3, most preferably 0.0001-0.1.

In one further embodiment, the weight ratio surfactant (ii):luminescent crystals (i) is in the range of 100-0.01, preferably 50-0.015, most preferably 3-0.02.

In one further embodiment the polymer or pre-polymer concentration is in the range of 0.1-30 wt %, preferably 0.5-20 wt %, most preferably 1-10 wt % of the total composition.

As outlined above, component (i) and (ii) are mandatory, while component (iii) and (iv) are optional. The invention thus relates to inks containing (i.e. comprising or consisting of):
- components (i), (ii) whereby (ii) is liquid, no (iii) no (iv);
- components (i), (ii), (iii), no (iv);
- components (i), (ii), (iv), no (iii) (solvent-free ink);
- components (i), (ii), (iii) and (iv)
- components (i), liquid (ii), no (iii), no (iv) (concentrate).

In one further embodiment, the composition comprises component (i), (ii), (iii) and (iv), wherein component (ii) comprises aromatic hydrocarbons, preferably toluene or cycloalkane, preferably cyclohexane and component (iv) comprises cyclic olefin copolymers.

In one further embodiment, the composition comprises component (i), (ii), (iii) and (iv), wherein component (ii) comprises linear alkanes and/or aromatic hydrocarbons and/or cycloalkane and component (iv) comprises styrene copolymers and/or styrene block-copolymers.

In a preferred embodiment, the composition comprises luminescent crystals of formula (I) selected from the group of $FA_1Pb_1X_3$. In this embodiment, the surfactant (ii) preferably comprises a zwitterionic surfactant, and/or polymer/pre-polymer (iv) is selected from the group of acrylates.

Solvent-free ink: The invention provides for compositions in the form of a suspension as described herein, comprising components (i), (ii) and (iv), but which is free of, or essentially free of, solvents (iii). In this embodiment, the weight ratio LCs/QDs (i):liquid material (pre-polymer (iv)+surfactant (ii)) preferably is in the range of 0.0001-0.2, preferably 0.0001-0.1, most preferably 0.0001-0.01. Such compositions may be termed solvent-free inks and are particularly suitable for supplying it to manufacturers of components or devices as discussed below.

Pre-polymers particularly suitable for solvent-free inks include acrylates, epoxies, urethanes, silicones, styrenes. Again, the term pre-polymers includes monomers and oligomers thereof. Preferably solvent-free inks include acrylates.

An ink is considered solvent-free when containing less than 10 wt % solvent, preferably less than 1 wt % solvent.

In a further embodiment the solvent-free ink further comprises a polymerization initiator, such as a radical photoinitiator or a temperature sensitive radical initiator.

Concentrate: The invention provides for compositions in the form of a suspension as described herein, which is free of, or essentially free of, solvents (iii), which is free of or essentially free of pre-polymer (iv) and wherein surfactant (ii) is a liquid surfactant. In this embodiment, the weight ratio surfactant (ii):LCs/QDs (i) preferably is in the range of 100-0.01, preferably 50-0.015, most preferably 3-0.02.

The inks as described herein find many applications, they are particularly useful for converting blue light into white light, particularly with the use of a light emitting diode (LED).

In a third aspect, the invention relates to a solid polymer composition and its uses. The term solid polymer composition denotes an organic or inorganic polymer matrix comprising LCs/QD's as described herein. This aspect of the invention shall be explained in further detail below.

In one embodiment, the invention provides for a solid polymer compositions comprising (i) LCs/QDs as described herein, (ii) surfactants as described herein and (iii) a hardened/cured polymer, preferably selected from organic polymers.

In a further embodiment the organic polymer is preferably selected from the list of acrylate polymers, carbonate polymers, sulfone polymers, epoxy polymers, vinyl polymers, urethane polymers, imide polymers, ester polymers, furane polymers, melamine polymers, styrene polymers and silicone polymers. Accordingly, said polymer preferably contains repeating units of pre-polymers as described herein. Furthermore, the polymer can be linear or cross-linked.

In a further embodiment the organic polymer is preferably selected from the list of acrylate polymers, epoxy polymers, urethane polymers, styrene polymers, silicone polymers and cyclic olefin copolymers. Accordingly, said polymer preferably contains repeating units of pre-polymers as described herein. Furthermore the polymer can be linear or cross-linked.

In one embodiment, the organic polymer comprises styrene copolymers and/or styrene block-copolymers, preferably block-copolymers of styrene and isoprene and block-copolymers of styrene, ethylene and butene.

The amount of LCs/QDs in the inventive solid polymer composition may vary over a broad range, but typically is 10 ppm or more. In one embodiment, the weight ratio LCs/QDs:matrix (polymer+surfactant) in said solid polymer composition is in the range of 0.00001-0.2, preferably 0.00005-0.15, most preferably 0.0001-0.1. In one embodiment, the inventive solid polymer composition is present in the form of granules, said granules preferably comprising 1-10 wt % of the LCs/QDs described herein. In one further embodiment, the inventive solid polymer composition is present in the form of a film, said film preferably comprising 0.01-0.5 wt % of the LCs/QDs described herein.

In one embodiment, the weight ratio surfactant:LCs/QDs in said solid polymer composition is in the range of 100-0.01, preferably 50-0.015, most preferably 3-0.02.

In a further embodiment the quantum yield of solid polymer compositions of the present invention is >20%, preferably >50%, most preferably >70%.

In a further embodiment the FWHM of solid polymer compositions of the present invention for visible emissions is <50 nm, preferably, <40 nm, most preferably <30 nm.

In a fourth aspect, the invention relates to a component (also termed an intermediate good) comprising a sheet-like substrate coated with one or more layers, wherein at least one of said layers is a functional layer, wherein said functional layer comprises a solid polymer composition as described herein. This aspect of the invention shall be explained in further detail below.

In an advantageous embodiment, functional layer converts blue light into white light. The invention thus provides for the use of a solid polymer composition for converting blue light into white light, particularly with the use of a light emitting diode (LED) or in a liquid crystal display.

In a fifth aspect, the invention relates to novel devices/articles comprising a solid polymer composition as described herein. This aspect of the invention shall be explained in further detail below.

In one embodiment, the invention provides for a device, selected from the group of electronic devices and optical devices, wherein said device comprises a substrate and a functional layer as described herein (forth aspect of the invention). Such device may be selected from the group consisting of displays, mobile devices, light emitting devices, and solar cells, particularly wherein the device is a liquid crystal display (LCD) or a quantum dot LED (QLED).

In one embodiment, the invention provides for an article comprising a substrate and a coating, particularly a decorative coating, said coating comprises LCs/QDs of formula (I) as described herein and surfactant as described herein.

In a sixth aspect, the invention relates to a method of manufacturing polymer compositions as described herein. The method comprises the steps known in the art, but by using an ink as described herein ($2^{nd}$ aspect) as one, or the sole, starting material.

In a seventh aspect, the invention relates to a method of manufacturing components/intermediate goods as described herein. This aspect of the invention shall be explained in further detail below.

The components/intermediate goods according to the present invention may be obtained by solution processes. This is considered a significant advantage, as it enables manufacturing of all layers by simple technologies applicable to large areas and continuous processing. Accordingly, the invention also provides methods for manufacturing a component as described herein, said method comprising the step of (e) providing a substrate and (f) depositing a solid polymer composition as described herein on said substrate, preferably by coating or printing of an ink as described herein followed by drying and/or curing.

In an eighth aspect, the invention relates to a method of manufacturing electronic devices as described herein. This aspect of the invention shall be explained in further detail below.

The manufacturing of devices starting from the above described components is known per se, but not yet applied to the specific components of the present invention.

To further illustrate the invention, the following examples are provided. These examples are provided with no intent to limit the scope of the invention. If not stated otherwise, all of the chemicals were purchased from Aldrich.

Figure 1A:
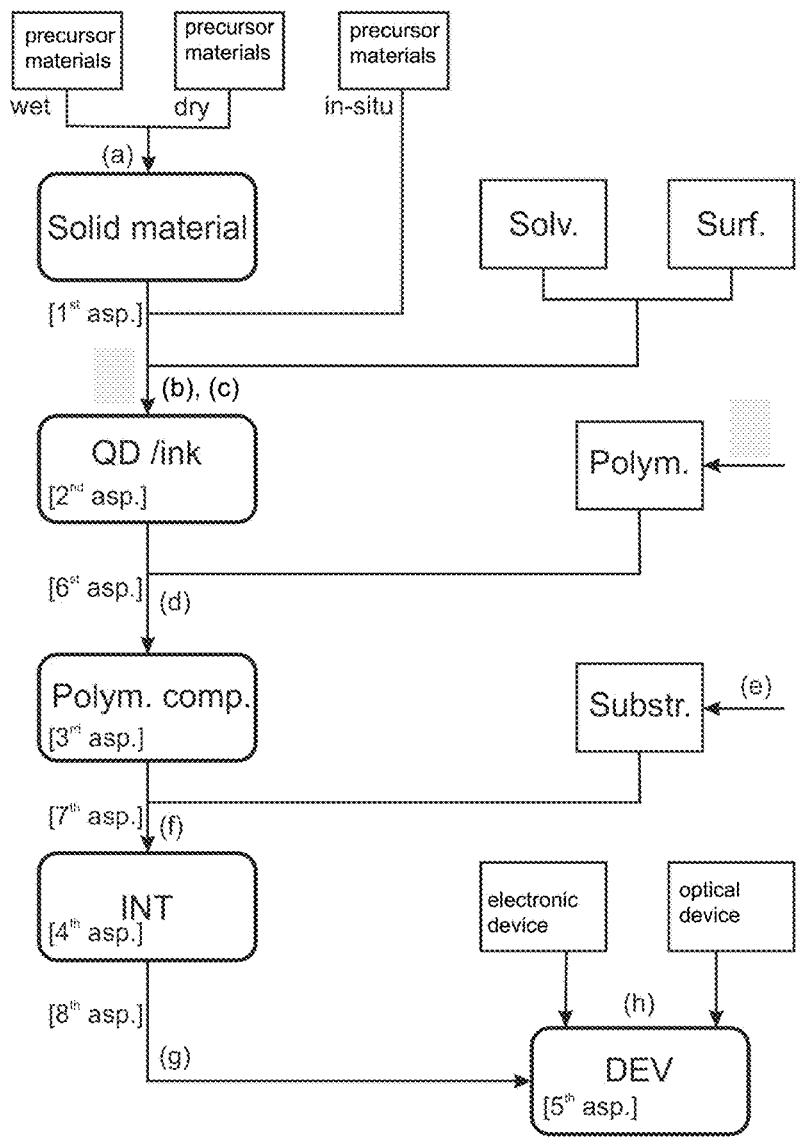
Figure 1B:
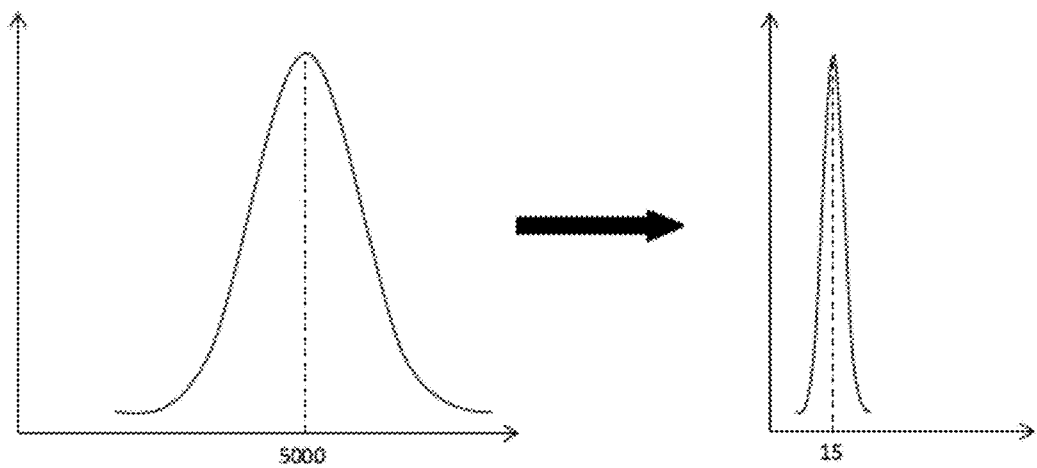
Figure 2:
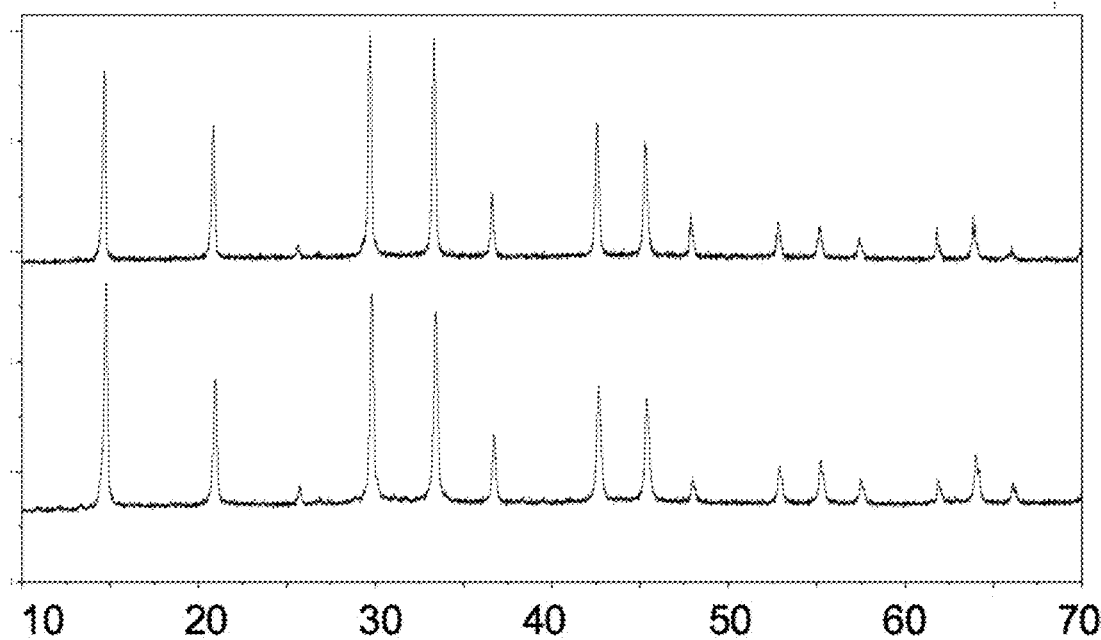
FIG. 2 shows X-ray diffraction patterns of the starting material $FAPbBr_3$ obtained by two different preparation methods as described in the present invention. X-axis: 2theta)(°; y axis: intensity (arb. units); top: $FAPbBr_3$ from solution according to ex.1; bottom: $FAPbBr_3$ from dry milling according to ex.2.

Example 1: Synthesis from Solid Material Obtained by Precipitation Method (Solid Material from Solution Step (a): Formamidinium lead tribromide ($FAPbBr_3$) was synthesized by dissolving $PbBr_2$ and FABr in N,N-dimethylformamidinium (DMF, >99.8%, puriss., Sigma Aldrich):Gamma-butyrolactone (GBL, >99% Sigma Aldrich) 1:1 vol mixture. Namely, 4 mmol $PbBr_2$ (1.468 g, 98+% Alfa Aesar) and 4 mmol FABr (0.500 g, Dyesol) were dissolved in 4 ml DMF/GBL at 25° C. with vigorous stirring. Orange $FAPBBr_3$ crystallites of around 1-5 mm size were grown by heating the solution to 80° C. for 24 h. These were further filtered and vacuum dried for another 24 h at room temperature. The crystal phase (cubic) and composition were confirmed by XRD (FIG. 2, top spectrum). This material does not show any luminescence.

Step (b): The dried $FAPbBr_3$ crystallites were crushed with pestle and mortar to a powder and added to Oleylamine (80-90%, Acros) ($FAPbBr_3$:Oleylamine=2:1) and Toluene (>99.7%, Fluka). The final concentration of $FAPbBr_3$ was 1 wt %. The mixture was then dispersed by ball milling using Yttrium stabilized zirconia beads with a size of 50 microns at ambient conditions for a period of 1 h yielding an ink with green luminescence.

Analysis: The resulting optical properties of the ink were measured in a 10 mm quartz cuvette (3 μl of the ink diluted in 3 ml of toluene) with a spectrofluorimeter equipped with an integrating sphere (Quantaurus Absolute PL quantum yield measuring system C1134711, Hamamatsu). The photoluminescence quantum yield of above ink was 83% with an emission peak centered at 511 nm. The FWHM of the emission was determined as 29 nm.

Figure 3:
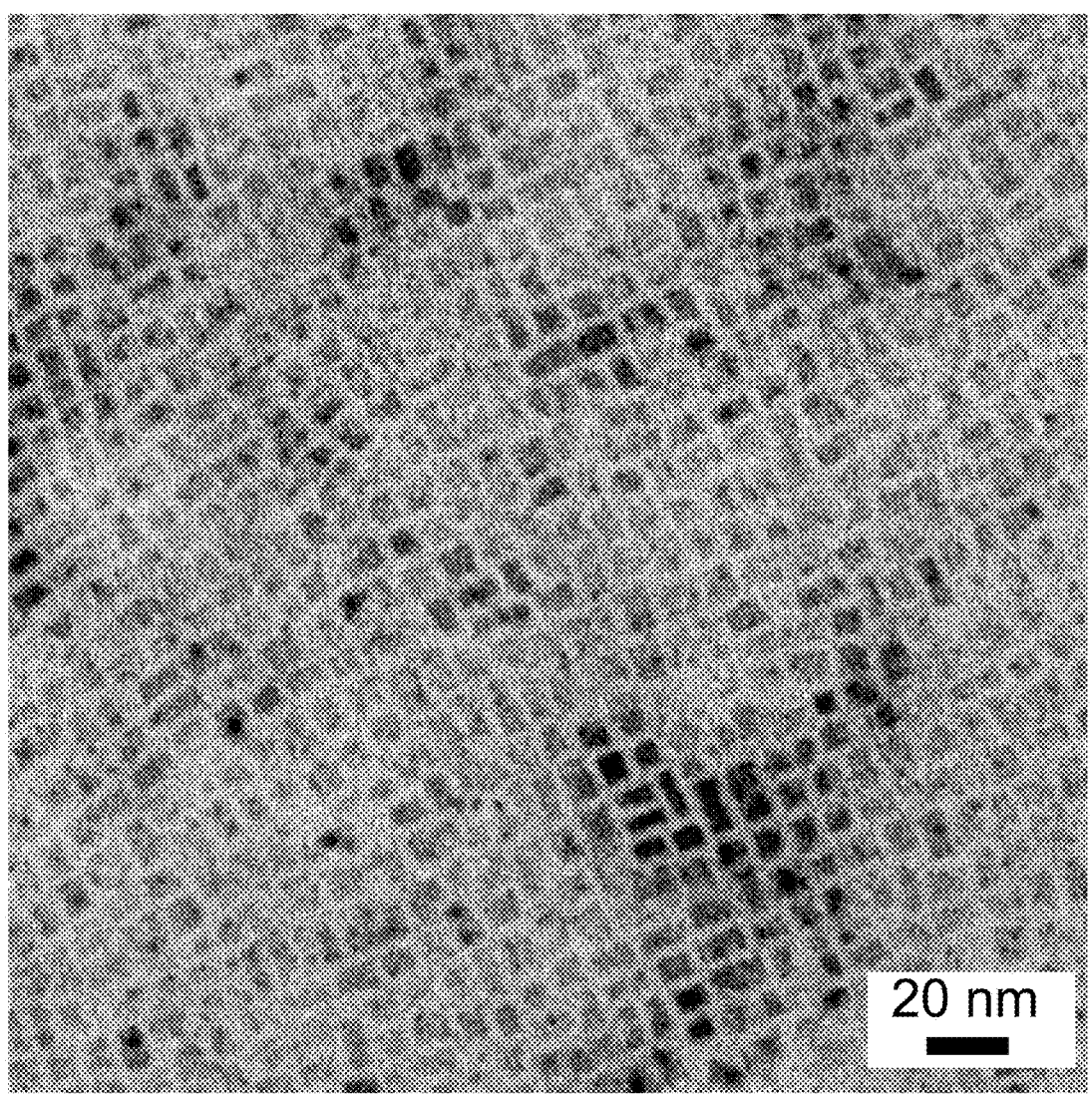
FIG. 3 shows a TEM image of $FAPbBr_3$ LCs synthesized according to the present invention, showing the cubic nature of the crystal structure.

TEM analysis of the ink (FIG. 3) showed the presence of cubic shaped particles with a very narrow particle size distribution.

Conclusion: This example shows the effectiveness of the inventive method.

Example 2: Synthesis from Solid Material Obtained Via Dry Milling Method

Step (a): Formamidinium lead tribromide ($FAPbBr_3$) was synthesized by milling $PbBr_2$ and FABr. Namely, 16 mmol $PbBr_2$ (5.87 g, 98% ABCR) and 16 mmol FABr (2.00 g, Dyesol) were milled with Yttrium stabilized zirconia beads (5 mm diameter) for 6 h to obtain pure cubic $FAPbBr_3$, confirmed by XRD (FIG. 2, bottom spectrum). This material did not show any luminescence. The hydrodynamic particle size distribution (volume weighted) was obtained by centrifugal sedimentation method (LUMiSizer, LUM GmbH) mixing 12 mg of powder with 10 ml S20 Viscosity Oil Standard (psi rheotek) and using a 2 mm polyamide cuvette. An average particle size (D50) of 7 microns and a size range (D10-D90) of 1-12 microns resulted.

Step (b): The orange $FAPbBr_3$ powder was added to Oleic acid (90%, Sigma Aldrich), Oleylamine (80-90, Acros) ($FAPbBr_3$:Oleic acid:Oleylamine=2:1:1) and Cyclohexane (>99.5%, puriss, Sigma Aldrich). The final concentration of $FAPbBr_3$ was 1 wt %. The mixture was then dispersed by ball milling using Yttrium stabilized zirconia beads with a size of 200 microns at ambient conditions for a period of 1 h yielding an ink with green luminescence.

Analysis: Luminescence properties of the ink were recorded as presented in Example 1. The photoluminescence quantum yield (PLQY) of above ink was 97% with an emission peak centered at 522 nm (=peak position, PP). The FWHM of the emission was determined as 42 nm.

Film formation: The green emitting ink was then mixed with 10% cyclic olefin copolymer (COC, TOPAS Advanced Polymers) solution in toluene, coated on a glass substrate and dried at 60° C. for 15 minutes. After drying the resulting optical properties of film were measured with a spectrofluorimeter equipped with an integrating sphere (Quantaurus Absolute PL quantum yield measuring system C1134711, Hamamatsu).

Analysis: The photoluminescence quantum yield of the film was 90% with an emission peak centered at 528 nm. The FWHM was determined as 30 nm. The resulting film was subjected to a degradation test for 2 h with increased temperature in a drying oven (80° C., ambient humidity). The photoluminescence quantum yield of the film after degradation was 79% with an emission peak centered at 527 nm. The FWHM was determined as 30 nm.

Conclusion: This example shows the effectiveness of the inventive method with solid material derived from dry milling and the preparation and degradation stability of a solid polymer composition as described in the present invention.

Examples 3-8: Synthesis Using Alternative Surfactants, Solvents

Step (a): Formamidinium lead tribromide ($FAPbBr_3$) was synthesized as described in Example 2.

Step (b): The following further experiments were all conducted by ball milling using similar process parameters (LCs/QDs:total surfactant ratio=2:1, milling bead size=200 microns, milling time=60 min, LCs/QDs concentration in the ink=1%, filtered by 0.45 um PTFE syringe filter for optical characterization, optical characterization was identical as in Example 1):

| Ex. # | Solid material | Surfactant | solvent | Peak emission/ FWHM/QY |
|---|---|---|---|---|
| 3 | FAPbBr$_3$ | (N,N-dimethyl-octadecylammonio) propane sulfonate | cyclo-hexane | yellow-green, 534 nm/23 nm/91% |
| 4 | FAPbBr$_3$ | N-Oleoyl-gamma-aminobutyric acid | cyclo-hexane | Green, NA/ NA/NA |
| 5 | FAPbBr$_3$ | Oleylammonium bromide | toluene | Green, 518 nm/ 26 nm/76% |
| 6 | FAPbBr$_3$ | N-Dodecyl-N,N-(dimethylammonio)butyrate (zwitterionic carboxylate) | toluene | Green/NA/ NA/NA |
| 7 | FAPbBr$_3$ | N-Dodecyl-N,N-(dimethylammonio)buty-rate:Oleylamine = 1:2 | toluene | Green/532 nm/ 21 nm/86% |
| 8 | FAPbBr$_3$ | Hexadecyl phosphocholine (zwitterionic phosphonate) | toluene | Green/537 nm/ 26 nm/40% |

Conclusion: These examples show the effectiveness of the inventive method using different surfactant classes and solvents.

Example 9: Synthesis from Solid Material Composed of a Mixture of Two Different Precursors Step (a): Commercial FABr (Dyesol) and PbBr$_2$ (98%, ABCR) powders were mixed in equal molar ratio leading to a net stoichiometric composition of FAPbBr$_3$.

Step (b): The salt mixture was added to Oleylamine (80-90%, Acros) and Oleic acid (90%, Sigma Aldrich) (FAPbBr$_3$:Oleylamine:Oleic acid=2:1:1) and Cyclohexane (>99.5%, puriss, Sigma Aldrich). The final concentration of FAPbBr$_3$ was 1 wt %. The mixture was then dispersed by ball milling by using Yttrium stabilized zirconia beads with a size of 200 microns at ambient conditions for a period of 60 min yielding an ink with green luminescence.

Analysis: Luminescence properties of the ink were recorded as presented in Example 1. The photoluminescence quantum yield of above ink was 48% with an emission peak centered at 503 nm. The FWHM of the emission was determined as 37 nm.

Conclusion: This example shows the effectiveness of the inventive method using in situ formation as described in the present invention.

Example 10: Thermal Stability Comparison of Organic, Inorganic and Organic-Inorganic LCs Synthesis: The following compositions of material were obtained by the same dry milling method as described in Example 2: CsPbBr$_3$, Cs$_{0.85}$FA$_{0.15}$PbBr$_3$, Cs$_{0.5}$FA$_{0.5}$PbBr$_3$, Cs$_{0.15}$FA$_{0.85}$PbBr$_3$. Luminescent inks and films were prepared analogous to the procedure described in Example 2.

Analysis: XRD revealed no peaks of the solid material (dry milled starting material) CsBr, FABr nor PbBr$_2$ corroborating the formation of a single phase of mixed cations in the crystal lattice.

Centrifugal sedimentation method (LUMiSizer, LUM GmbH) showed similar hydrodynamic size distribution for all materials with D10 between 0.8-2 microns, D50 between 1-12 microns, and D90 between 4-35 microns. TEM images of inks from FAPbBr$_3$ (FIGS. 4a and 4b), Cs$_{0.85}$FA$_{0.15}$PbBr$_3$ (FIG. 5) and Cs$_{0.5}$FA$_{0.5}$PbBr$_3$ (FIG. 6) show LCs of size in the range of 5-50 nm.

Table 2 shows the optical properties of the ink and the film as initially obtained. Table 3 shows the properties of the film after degradation for 2 hours at 80° C. and ambient humidity (i.e. approx. 5% rel. humidity) as well as after degradation for 2 h at 60° C., 90% rel. humidity.

TABLE 2

| | Ink properties | | | Film properties | | |
|---|---|---|---|---|---|---|
| Composition | PLQY (%) | PP (nm) | FWHM (nm) | PLQY (%) | PP (nm) | FWHM (nm) |
| CsPbBr$_3$ | 42* | 507* | 40* | 90 | 514 | 23 |
| Cs$_{0.99}$FA$_{0.01}$PbBr$_3$ | 42* | 507* | 46* | 86 | 515 | 23 |
| Cs$_{0.95}$FA$_{0.05}$PbBr$_3$ | 38* | 506* | 48* | 80 | 514 | 25 |
| Cs$_{0.85}$FA$_{0.15}$PbBr$_3$ | 54* | 504* | 38* | 74 | 513 | 25 |
| Cs$_{0.5}$FA$_{0.5}$PbBr$_3$ | 58* | 496* | 50* | 74 | 510 | 27 |
| Cs$_{0.15}$FA$_{0.85}$PbBr$_3$ | 88* | 512* | 38* | 85 | 522 | 26 |
| FAPbBr$_3$ | 97* | 522* | 42* | 92 | 530 | 31 |

*measurement result might be biased because of dilution effects of the ink

3TABLE 3

| | Degraded film properties 2 h 80° C. | | | Degraded film properties 2 h 60° C./90% RH | | |
|---|---|---|---|---|---|---|
| Composition | PLQY (%) | PP (nm) | FWHM (nm) | PLQY (%) | PP (nm) | FWHM (nm) |
| CsPbBr$_3$ | 68 | 515 | 24 | 60 | 515 | 22 |
| Cs$_{0.99}$FA$_{0.01}$PbBr$_3$ | 66 | 516 | 23 | 80 | 517 | 21 |
| Cs$_{0.95}$FA$_{0.05}$PbBr$_3$ | 58 | 515 | 25 | 68 | 517 | 22 |
| Cs$_{0.85}$FA$_{0.15}$PbBr$_3$ | 37 | 514 | 25 | 53 | 519 | 22 |
| Cs$_{0.5}$FA$_{0.5}$PbBr$_3$ | 29 | 512 | 25 | 66 | 512 | 26 |
| Cs$_{0.15}$FA$_{0.85}$PbBr$_3$ | 60 | 521 | 26 | 58 | 519 | 26 |
| FAPbBr$_3$ | 76 | 530 | 30 | 86 | 525 | 28 |

Conclusion: The data clearly show the high PLQY for both, ink and film. For films, this high PLQY is maintained even after stress-test under severe conditions.

Example 11: Synthesis of Red Emitting LCs from Solid Material Obtained Via Dry Milling Method Step (a): Commercial formamidinium iodide (>99%, Dyesol) and PbI$_2$ (98.5%, Alfa Aesar) were mixed in equal molar ratio leading to a net stoichiometric composition of FAPbI$_3$. The powder mixture was dry-milled using Yttrium stabilized zirconia beads with a size of 5 millimeters at ambient conditions for a period of 400 min, and subsequently dried at 80° C.

Step (b): The salt mixture was added to oleylamine (80-90%, Acros Organics) and oleic acid (90%, Sigma Aldrich) (CsPbBr$_3$:Oleylamine:oleic acid=2:1:1) in cyclohexane 99%, Sigma Aldrich). The final concentration of FAPbI$_3$ was 1% wt. The mixture was then dispersed by ball milling using Yttrium stabilized zirconia beads with a size of 200 microns at ambient conditions for a period of 60 min yielding an ink with red luminescence. Film sample was prepared analogous to the procedure in Example 2.

Analysis: The photoluminescence quantum yield of above polymer film was 71% with an emission peak centered at 758 nm. The FWHM of the emission was determined as 89 nm.

Conclusion: This result clearly shows that red emitting LCs composed of FAPbI$_3$ may be obtained with the inventive method.

Example 12: Synthesis of Green Emitting LCs and Transfer into a Suspension Containing Pre-Polymer/Polymer and a Solid Polymer Composition Thereof Step (a): FAPbBr$_3$ was obtained as described in Example 2.

Step (b): The orange FAPbBr$_3$ powder was added to (Lauryldimethylammonio)acetate (>95%, Sigma Aldrich), Oleylamine (80-90%, Acros) (FAPbBr$_3$:(Lauryldimethyl-ammonio)acetate:Oleylamine=1:0.1:0.3) and toluene (>99.7%, Fluka). The final concentration of FAPbBr$_3$ was 1 wt %. The mixture was then dispersed by ball milling using Yttrium stabilized zirconia beads with a size of 200 microns at ambient conditions for a period of 1 h yielding an ink with green luminescence.

Analysis: Luminescence properties of the ink were recorded as presented in Example 1. The photoluminescence quantum yield (PLQY) of above ink was 88% with an emission peak centered at 528 nm (=peak position, PP). The FWHM of the emission was determined as 24 nm.

Film formation: The green emitting ink was then mixed with different polymers/pre-polymers. For acrylates 1 wt % Irgacure 184 as an initiator was mixed with the acrylate. The toluene from the acrylate/ink mixture was evaporated at room temperature by vacuum (10$^{-2}$ mbar) and the mixture was coated between two glass substrates with a thickness of 100 µm and cured with UV (Hoenle UVAcube 100, Hg lamp with quartz filter, 1 min). For cyclic olefin copolymer, polycarbonate (Makrolon OD2015) and polystyrene (Mw=35,000, Sigma Aldrich), films were obtained analogous to Ex.2.

Analysis: Table 4 shows the optical properties of the film measured with a spectrofluorimeter equipped with an integrating sphere (Quantaurus Absolute PL quantum yield measuring system C1134711, Hamamatsu).

TABLE 4

| | | Initial film properties | | |
|---|---|---|---|---|
| Ex. # | Polymer | PLQY (%) | PP (nm) | FWHM (nm) |
| 6: | Acrylate* | 79 | 531 | 27 |
| 7: | Cyclic olefin copolymer | 83 | 531 | 24 |
| 8: | polycarbonate** | 86 | 525 | 27 |
| 9: | Polystyrene | 84 | 531 | 26 |

*Sartomer SR506D:Sartomer SR595 (95 wt %:5 wt %);
**Makrolon OD2015

Conclusion: This example shows the effectiveness of the inventive method in preparing a suspension and a solid polymer composition using different polymers.

Example 13: Synthesis of a Suspension by Ultrasonication

Step (a): FAPbBr$_3$ was obtained as described in Example 2.

Step (b): The orange FAPbBr$_3$ powder was added to (Lauryl-dimethylammonio)acetate (>95%, Sigma Aldrich), Oleylamine (80-90%, Acros) (FAPbBr$_3$:(N,N-dimethyl-octadecylammonio) propane sulfonate:Oleylamine=3:0.1:0.2) and toluene (>99.7%, Fluka). 10 g of the mixture was then dispersed by ultrasonication using a 50 W ultrasonic generator at 50% amplitude and an ultrasonic horn with diameter 5 mm (Dr. Hilscher, UP50H). The process time was 30 min and the temperature was noted to be 72° C. This procedure yielded an ink with green luminescence.

Analysis: Luminescence properties of the ink were recorded as presented in Example 1. The photoluminescence quantum yield (PLQY) of above ink was 53% with an emission peak centered at 528 nm (=peak position, PP). The FWHM of the emission was determined as 30 nm.

The invention claimed is:
1. A composition in the form of a suspension, the suspension comprising:
(a) an internal solid phase; and
(b) an external liquid phase,
wherein the internal solid phase (a) comprises:
(i) luminescent crystals of 3-500 nm size of formula (I)

$$[M^1A^1]_aM^2{}_bX_c \qquad (I),$$

wherein:
A$^1$ represents one or more organic cations selected from the group consisting of ammonium, formamidinium, guanidinium, imidazolium, pyridinium, pyrrolidinium, and protonated thiourea,
M$^1$ is optional, and if present, represents one or more alkaline metals selected from Cs, Rb, K, Na, and Li,
M$^2$ represents one or more metals selected from the group consisting of Ge, Sn, Pb, Sb, and Bi,
X represents one or more anions selected from the group consisting of chloride, bromide, iodide, cyanide, thiocyanate, isothiocyanate and sulfide,
a represents 1-4,
b represents 1-2,
c represents 3-9; and
wherein the external liquid phase (b) comprises:
(ii) surfactant selected from the group of zwitterionic surfactants;
(iii) optionally solvent, said solvent, if present, selected from the group of aliphatic hydrocarbons, aromatic hydrocarbons, ethers, esters, alcohols, and ketones; and
(iv) optionally polymer and/or pre-polymer, said polymer or pre-polymer, if present, selected from the group of acrylates, epoxies, vinyl polymers, urethanes, styrenes, silicones and cyclic olefinic copolymers.

2. The composition according to claim 1, wherein the weight ratio luminescent crystals (i):liquid material of external liquid phase (b) is in the range of 0.0001-0.5, wherein the weight of the liquid material is defined as surfactant (ii)+solvent (iii), if present, +prepolymer (iv), if present.

3. The composition according to claim 1, wherein the weight ratio surfactant (ii) in the external liquid phase (b):luminescent crystals (i) is in the range of 100-0.01.

4. The composition according to claim 1, wherein the polymer or pre-polymer is present in the external liquid phase (b) and the concentration of the polymer or prepolymer is in the range of 0.1-30 wt %, of the total composition.

5. The composition according to claim 1, wherein the zwitterionic surfactant of the external liquid phase comprises apolar end-groups selected from the group of alkyl or alkyl-ether chains with 4-30 carbon atoms.

6. The composition according to claim 1,
which is free of, or essentially free of, solvent (iii) and wherein the weight ratio of luminescent crystals (i):liquid material in the external liquid phase (b) is in the range of 0.0001-0.2, the weight of liquid material being defined as pre-polymer (iv), if present, +surfactant (ii), and the weight of liquid material does not include any polymer present.

7. The composition according to claim 1,
wherein surfactant (ii) is a liquid surfactant and wherein the external liquid phase (b) is free of solvents (iii) and pre-polymer (iv); and
wherein the weight ratio surfactant (ii) in the external liquid phase (b):luminescent crystals (i) is in the range of 100-0.01.

8. The composition according to claim 1, wherein the luminescent crystals (i) have the formula $FAPbX_3$, wherein FA represents formamidinium; and
wherein the pre-polymer (iv) is present in the external liquid phase (b) and is selected from the group comprising isobornylacrylate and dicyclopentadienyl-acrylate.

9. The composition according to claim 1, wherein the luminescent crystals (i) have the formula $FAPbX_3$, wherein FA represents formamidinium; and
the pre-polymer/polymer (iv) of the external liquid phase (b) is present and is selected from the group of acrylates.

10. The composition of claim 1, wherein the surfactant (ii) of the external liquid phase (b) is a zwitterionic surfactant selected from the group consisting of ammonium sulfonates having the formula (V-2.1),

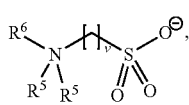

(V-2.1)

wherein:
$R^5$ is H or methyl,
$R^6$ is an apolar tail, selected from substituted or unsubstituted hydrocarbons, and
v is 1-8.

11. A solid polymer composition, comprising:
(i) luminescent crystals of 3-500 nm size of formula (I)

$$[M^1A^1]_aM^2_bX_c \quad (I),$$

wherein:
$A^1$ represents one or more organic cations selected from the group consisting of ammonium, formamidinium, guanidinium, imidazolium, pyridinium, pyrrolidinium, protonated thiourea,
$M^1$ is optional, and if present, represents one or more alkaline metals selected from Cs, Rb, K, Na, Li,
$M^2$ represents one or more metals selected from the group consisting of Ge, Sn, Pb, Sb, and Bi,
X represents one or more anions selected from the group consisting of chloride, bromide, iodide, cyanide, thiocyanate, isothiocyanate and sulfide,
a represents 1-4,
b represents 1-2,
c represents 3-9; and
(ii) surfactant selected from the group of zwitterionic surfactants; and
(iv) a hardened/cured polymer, said polymer selected from the group of acrylate polymers, epoxy polymers, vinyl polymers, urethane polymers, styrene polymers, silicone polymers and cyclic olefin copolymers.

12. The solid polymer composition according to claim 11, wherein the weight ratio luminescent crystals:matrix is in the range of 0.00001-0.2, the weight of the matrix defined as polymer+surfactant.

13. The solid polymer composition according to claim 11, wherein the weight ratio surfactant:luminescent crystals is in the range of 100-0.01.

14. The solid polymer composition according to claim 11, wherein
the luminescent crystals (i) are selected from the group of $FAPbX_3$, wherein FA represents formamidinium; and
the polymer (iv) is selected from the group of acrylates.

15. The solid polymer composition of claim 14 in the form of a film having a thickness of 3-200 nm.

16. The solid polymer composition according to claim 11, wherein the luminescent crystals (i) are selected from the group of $FAPbX_3$, wherein FA represents formamidinium.

17. The solid polymer composition according to claim 11, wherein the polymer (iv) is selected from the group of acrylates.

18. A component comprising a sheet-like substrate coated with one or more layers, wherein at least one of said layers is a functional luminescent crystal containing layer, wherein said functional luminescent crystal containing layer comprises a solid polymer composition according to claim 11.

19. A component comprising a sheet-like substrate coated with one or more layers, wherein at least one of said layers is a functional luminescent crystal containing layer, wherein said functional luminescent crystal containing layer comprises a solid polymer composition according to claim 14.

20. A component comprising a sheet-like substrate coated with one or more layers, wherein at least one of said layers is a functional luminescent crystal containing layer, wherein said functional luminescent crystal containing layer comprises a solid polymer composition according to claim 15.

21. A device, selected from the group of electronic devices and optical devices, wherein
said device comprises a substrate and a functional luminescent crystal containing layer; and
said functional luminescent crystal containing layer comprises a solid polymer composition according to claim 11.

22. A device, selected from the group of electronic devices and optical devices, wherein
said device comprises a substrate and a functional luminescent crystal containing layer; and
said functional luminescent crystal containing layer comprises a solid polymer composition according to claim 14.

23. A device, selected from the group of electronic devices and optical devices, wherein
said device comprises a substrate and a functional luminescent crystal containing layer; and
said functional luminescent crystal containing layer comprises a solid polymer composition according to claim 15.

24. An article comprising a decorative coating, wherein said article comprises a substrate and a coating,
said coating comprises a solid polymer composition according to claim 11.

* * * * *